US012575423B2

(12) United States Patent
Park et al.

(10) Patent No.: US 12,575,423 B2
(45) Date of Patent: Mar. 10, 2026

(54) WIRING BOARD AND SEMICONDUCTOR PACKAGE

(71) Applicant: Samsung Electronics Co., Ltd., Suwon-si (KR)

(72) Inventors: Sangwook Park, Hwaseong-si (KR); Sangnam Jeong, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 906 days.

(21) Appl. No.: 17/858,441

(22) Filed: Jul. 6, 2022

(65) Prior Publication Data

US 2023/0127676 A1 Apr. 27, 2023

(30) Foreign Application Priority Data

Oct. 25, 2021 (KR) ........................ 10-2021-0142652

(51) Int. Cl.
| | |
|---|---|
| *H01L 23/00* | (2006.01) |
| *H01L 23/498* | (2006.01) |

(Continued)

(52) U.S. Cl.
CPC ........ *H01L 23/66* (2013.01); *H01L 23/49816* (2013.01); *H01L 23/49822* (2013.01);
(Continued)

(58) Field of Classification Search
CPC ..... H01L 2223/6622; H01L 2223/6638; H01L 2224/16227; H01L 2224/32225; H01L 2224/32245; H01L 2224/73204; H01L 2224/73253; H01L 23/3675; H01L 23/49816; H01L 23/49822; H01L 23/49833; H01L 23/49838; H01L 23/66;
(Continued)

(56) References Cited

U.S. PATENT DOCUMENTS

| | | | |
|---|---|---|---|
| 6,534,872 B1 | 3/2003 | Freda et al. | |
| 8,319,111 B2 | 11/2012 | Saiki et al. | |

(Continued)

FOREIGN PATENT DOCUMENTS

| | | | | |
|---|---|---|---|---|
| CN | 103269562 B | * | 2/2016 | ............... H05K 1/02 |
| DE | 102008009955 A1 | | 6/2009 | |

(Continued)

*Primary Examiner* — Timothy J Thompson
*Assistant Examiner* — Guillermo J Egoavil
(74) *Attorney, Agent, or Firm* — Muir Patent Law, PLLC

(57) ABSTRACT

A semiconductor package includes a wiring board including at least one pair of connection structures electrically connecting at least one pair of differential signal transmission lines and at least one pair of differential signal transmission terminals, respectively. The at least one pair of connection structures includes first via structures staggered in a vertical direction, at least one first connection line electrically connecting the first via structures, second via structures staggered in the vertical direction, and at least one second connection line electrically connecting the second via structures. The at least one first connection line is spaced apart from the at least one second connection line in the vertical direction and electrically insulated therefrom, and intersects the at least one second connection line in the vertical direction.

20 Claims, 17 Drawing Sheets

(51) Int. Cl.
_H01L 23/66_ (2006.01)
_H01L 25/065_ (2023.01)

(52) U.S. Cl.
CPC .. _H01L 23/49833_ (2013.01); _H01L 23/49838_ (2013.01); _H01L 25/0655_ (2013.01); _H01L 24/16_ (2013.01); _H01L 24/32_ (2013.01); _H01L 24/73_ (2013.01); _H01L 2223/6622_ (2013.01); _H01L 2223/6638_ (2013.01); _H01L 2224/16227_ (2013.01); _H01L 2224/32225_ (2013.01); _H01L 2224/32245_ (2013.01); _H01L 2224/73204_ (2013.01); _H01L 2224/73253_ (2013.01); _H01L 2924/1616_ (2013.01); _H01L 2924/16235_ (2013.01); _H01L 2924/16251_ (2013.01); _H01L 2924/1632_ (2013.01); _H01L 2924/30111_ (2013.01); _H01L 2924/3025_ (2013.01)

(58) Field of Classification Search
CPC ....... H01L 23/00; H01L 23/498; H01L 24/13; H01L 24/16; H01L 24/32; H01L 24/73; H01L 25/0655; H01L 25/18; H01L 25/065; H01L 2924/1616; H01L 2924/16235; H01L 2924/16251; H01L 2924/1632; H01L 2924/30111; H01L 2924/3025

USPC .................................. 360/760; 257/245, 728
See application file for complete search history.

(56) References Cited

U.S. PATENT DOCUMENTS

| | | | |
|---|---|---|---|
| 8,530,755 B2 | 9/2013 | Wakita et al. | |
| 8,895,873 B2 | 11/2014 | Amano et al. | |
| 10,187,971 B2 | 1/2019 | Hareyama | |
| 2005/0088800 A1* | 4/2005 | Ooi | H01L 23/49838 |
| | | | 257/E23.114 |
| 2013/0240258 A1* | 9/2013 | Ishida | H05K 1/0306 |
| | | | 174/258 |
| 2014/0133108 A1 | 5/2014 | Kagaya | |
| 2021/0212198 A1 | 7/2021 | Okada et al. | |

FOREIGN PATENT DOCUMENTS

| | | | |
|---|---|---|---|
| JP | 2007287750 A | 11/2007 | |
| JP | 2010087037 A | 4/2010 | |
| WO | 2008105478 A1 | 9/2008 | |
| WO | WO-2020237445 A1 * | 12/2020 | ............. H01L 23/66 |

* cited by examiner

WIRING BOARD AND SEMICONDUCTOR PACKAGE

CROSS-REFERENCE TO RELATED APPLICATION(S)

This application claims the benefit of priority to 35 USC 119(a) of Korean Patent Application No. 10-2021-0142652 filed on Oct. 25, 2021 in the Korean Intellectual Property Office, the entire disclosure of which is incorporated herein by reference.

BACKGROUND

The present inventive concept relates to a wiring board and a semiconductor package.

A wiring board (e.g., a substrate for a semiconductor package) on which an electronic component (e.g., a semiconductor chip) is mounted includes a differential signal transmission line capable of reducing electromagnetic interference (EMI) and noise and transmitting data at high speed. The differential signal transmission line is designed such that the impedance of a pair of respective differential signal transmission lines is identical, to significantly reduce signal distortion. In the case in which stacked vias cannot be continuously formed according to a process rule, a routing technique for significantly decreasing loss of a differential signal transmitted through staggered vias is desired.

SUMMARY

Example embodiments provide a wiring board and a semiconductor package having improved electrical characteristics for a differential signal.

According to example embodiments, a semiconductor package includes a wiring board having an upper surface and a lower surface opposing each other, at least a first pair of differential signal transmission lines disposed on the upper surface, at least a first pair of differential signal transmission terminals disposed below the lower surface, and at least a first pair of connection structures electrically connecting the each line of the first pair of differential signal transmission lines to each terminal of the first pair of differential signal transmission terminals, respectively; a semiconductor chip disposed on the upper surface of the wiring board; and external connection bumps disposed below the lower surface of the wiring board to correspond to the first pair of differential signal transmission terminals, respectively. The first pair of connection structures includes first via structures disposed to be staggered along a vertical direction with respect to the lower surface, at least one first connection line electrically connecting the first via structures, second via structures staggered along the vertical direction, and at least one second connection line electrically connecting the second via structures, the at least one first connection line being spaced apart from the at least one second connection line in the vertical direction and electrically insulated therefrom, and crossing the at least one second connection line in the vertical direction.

According to example embodiments, a semiconductor package includes a wiring board having an upper surface and a lower surface opposing each other, the wiring board including at least a first pair of differential signal transmission lines disposed on the upper surface, at least a first pair of differential signal transmission terminals disposed below the lower surface, and at least a first pair of connection structures electrically connecting the first pair of differential signal transmission lines to the first pair of differential signal transmission terminals; a semiconductor chip disposed on the upper surface of the wiring board; and external connection bumps disposed below the lower surface of the wiring board to correspond to the first pair of differential signal transmission terminals, respectively. The first pair of connection structures includes first via structures alternately disposed and electrically connected to each other on a first axis and a second axis extending in a vertical direction with respect to the lower surface and spaced apart from each other in a horizontal direction with respect to the lower surface, and disposed between the first pair of differential signal transmission terminals when viewed from the vertical direction, and second via structures alternately disposed and electrically connected to each other on a third axis and a fourth axis extending in the vertical direction and spaced apart from each other in the horizontal direction, and disposed between the at first pair of differential signal transmission terminals without overlapping either signal transmission terminal of the first pair of signal transmission terminals when viewed from the vertical direction.

According to example embodiments, a semiconductor package includes a wiring board having an upper surface and a lower surface opposing each other, and including at least a first pair of signal transmission lines disposed on the upper surface, at least a first pair of signal transmission terminals disposed below the lower surface, and at least a first pair of connection structures, intersecting each other, and electrically connecting the first pair of signal transmission lines and the first pair of signal transmission terminals, respectively; and a semiconductor chip disposed on the upper surface of the wiring board.

According to example embodiments, a wiring board includes a body portion having an upper surface and a lower surface opposing each other; at least a first pair of differential signal transmission lines having first and second signal transmission lines disposed on the upper surface of the body portion; at least a first pair of differential signal transmission terminals having first and second differential signal transmission terminals disposed below the lower surface of the body portion; and at least a first pair of connection structures having first and second connection structures electrically connecting the first and second signal transmission lines to the first and second signal transmission terminals, respectively, and positioned between the pair of differential signal transmission terminals when viewed from a vertical direction with respect to the lower surface.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, example embodiments will be described with reference to the accompanying drawings.

Figure 1A:
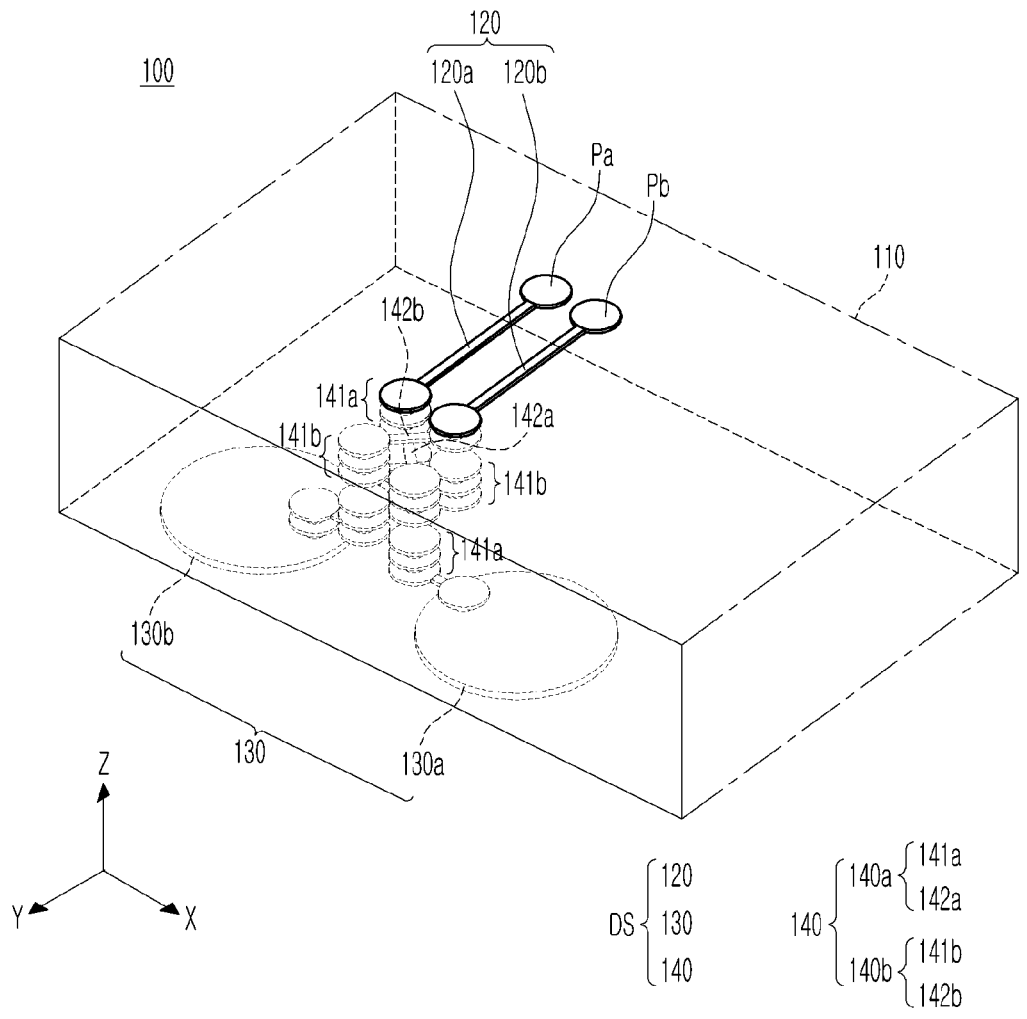
FIG. 1A is a perspective view illustrating a portion of a wiring board according to an example embodiment.
Figure 1B:
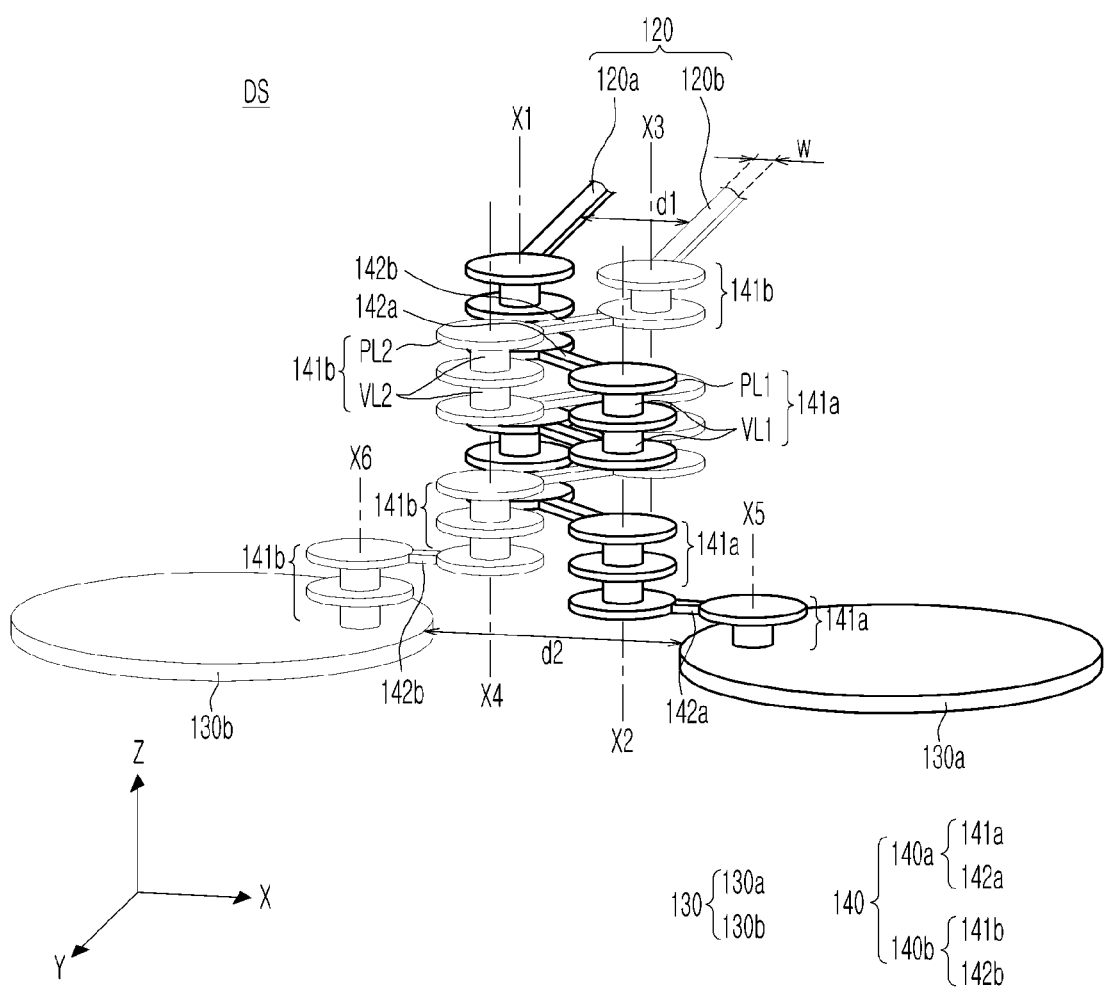
FIG. 1B is a perspective view illustrating a differential signal transmission structure of FIG. 1A.
Figure 1C:
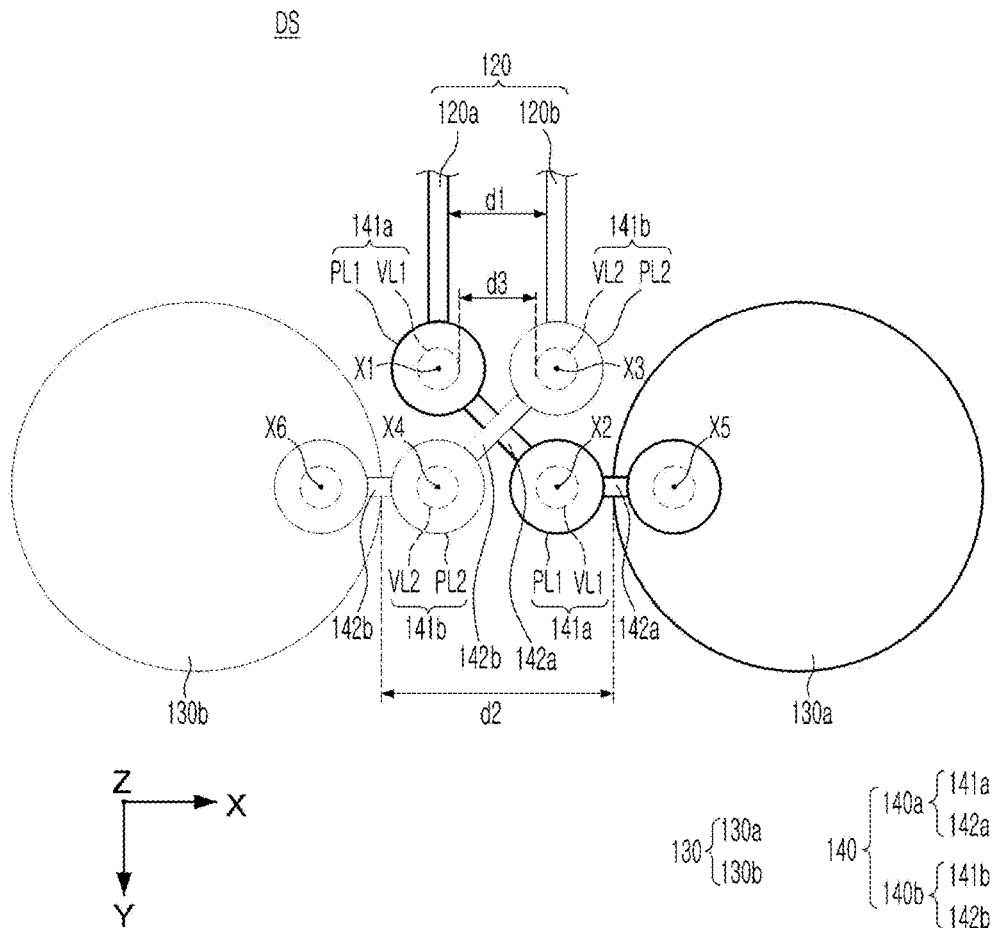
FIG. 1C is a plan view of the differential signal transmission structure of FIG. 1B.

FIG. 1A is a perspective view illustrating a portion of a wiring board 100 according to an example embodiment, FIG. 1B is a perspective view illustrating a signal transmission structure DS of FIG. 1A, and FIG. 1C is a top view of the signal transmission structure DS of FIG. 1B.

First, referring to FIG. 1A, the wiring board 100 according to an example embodiment may include a body portion 110, and at least one pair of signal transmission structures DS providing a signal transmission path within the body portion 110. For example, the pair of signal transmission structures DS may be a pair of differential signal transmission structures DS transmitting differential signals. To maintain the differential mode from the transmitting terminal to the receiving terminal of the differential signal and to significantly reduce signal loss, the differential signal transmission structures are designed such that respective impedances thereof are matched. However, if the shape of the differential signal transmission structure is limited according to the type of the wiring board 100, it may be difficult to maintain the differential mode until the receiving terminal, and signal loss may increase. For example, according to a process rule, the formation of stacked vias may be limited to 2 vias per stack or less or 3 vias per stack or less (e.g., vias stacked consecutively in a vertical direction), so that in a differential signal transmission path comprised of staggered vias, signal loss and distortion may be increased in a section (hereinafter, referred to as a 'via section') passing through multilayer vias, as compared with a differential signal transmission path formed of a full stack of vias stacked in a vertically overlapping manner in a vertical direction. According to an example embodiment of the present inventive concept, in a pair of differential signal transmission structures DS including staggered vias and the wiring board 100 including the same, loss of differential signals and distortion may be significantly reduced, using the arrangement relationship of staggered vias constituting the via section. Hereinafter, a pair of differential signal transmission structures, a pair of differential signal transmission lines, a pair of differential signal transmission terminals, and the like refer to a pair of components for transmitting a data signal, and thus, may be referred to generally as a pair of signal transmission structures, a pair of signal transmission lines, a pair of signal transmission terminals, respectively. For example, the signal transmitted through the pair of signal transmission structures DS according to example embodiments of the present inventive concept is not necessarily limited to the "differential signal." However, in some embodiments, the two different signal transmission paths having staggered vias stacked vertically are for a differential signal (e.g., a first signal and a second signal that together comprise a differential signal and that are, for example, 180 degrees out of phase with each other), so that one of the signal transmission paths is connected, for example, to a source providing the first signal (e.g., a clock signal or other control or data signal in one embodiment), and the other of the signal transmission paths is connected, for example, to a source providing the second signal (e.g., a clock bar signal or other control or data signal 180 degrees out of phase with the first signal, in one embodiment).

The body portion 110 may include an insulating material electrically and physically protecting the differential signal transmission structure DS, for example, a thermosetting resin such as an epoxy resin, a thermoplastic resin such as polyimide, or Ajinomoto Build-up Film (ABV), FR-4, or a prepreg containing an inorganic filler and/or glass fiber (Glass Fiber, Glass Cloth, Glass Fabric). A wiring circuit ('112' in FIG. 7) providing a transmission path for a data signal, a ground signal, power, or the like, in addition to the differential signal transmission structure DS, may be formed in the body portion 110. The body portion 110 may have an upper surface on which a semiconductor chip, an interposer substrate, or the like are mounted, and a lower surface on which an external connection terminal for connection to the main board is disposed. The upper surface and the lower surface of the body portion 110 oppose each other, and a differential signal transmission section (the above-described 'via section') comprised of staggered vias may be formed between the upper surface and the lower surface of the body portion 110 (e.g., to extend from the upper surface to the lower surface). In FIG. 1A, to clearly illustrate the differential signal transmission structure DS, the detailed structure of the body portion 110 is omitted, which will be described later with reference to FIGS. 2A and 2B.

The differential signal transmission structure DS may include at least one pair of differential signal transmission lines 120, at least one pair of differential signal transmission terminals 130, and at least one pair of connection structures 140. The differential signal transmission structure DS may include more pairs of differential signal transmission lines 120, differential signal transmission terminals 130, and connection structures 140 than those illustrated in the drawings. Hereinafter, for convenience of description, "a pair of differential signal transmission lines 120," "a pair of differential signal transmission terminals 130," and "a pair of connection structures 140" may be referred to as "differential signal transmission line 120," "differential signal transmission terminal 130," and "connection structure 140," respectively.

The differential signal transmission line 120 may have a first signal transmission line 120a and a second signal transmission line 120b disposed on the upper surface of the body portion 110. The first signal transmission line 120a and the second signal transmission line 120b may be the uppermost wiring patterns of differential signal transmission structures DS, extending along the upper surface of the body portion 110. For each of the first signal transmission line 120*a* and the second signal transmission line 120*b*, one end may be connected to a respective first pad portion Pa and a second pad portion Pb to which an external circuit, for example, a circuit of a semiconductor chip or an interposer substrate is connected. The first pad portion Pa and the second pad portion Pb may be formed to have diameters greater than the line widths of the first signal transmission line 120*a* and the second signal transmission line 120*b*, respectively. The connection structures 140 forming a differential signal transmission section, between the upper and lower surfaces of the body portion 110, may be connected to the other end of each of the first signal transmission line 120*a* and the second signal transmission line 120*b*.

The differential signal transmission terminal 130 may have a first differential signal transmission terminal 130*a* and a second differential signal transmission terminal 130*b* disposed below the lower surface of the substrate portion 110. The first differential signal transmission terminal 130*a* and the second differential signal transmission terminal 130*b* may be lowest wiring pads of the differential signal transmission structures, disposed below the lower surface of the substrate portion 110. In the drawings, the first differential signal transmission terminal 130*a* and the second differential signal transmission terminal 130*b* each include only a wiring pad, but according to an example embodiment, a wiring pattern extending along the lower surface of the body portion 110 and a wiring pad connected to one end of the wiring pattern may be included. The first differential signal transmission terminal 130*a* and the second differential signal transmission terminal 130*b* may be disposed to be spaced apart from each other by a predetermined distance. The distance between the first differential signal transmission terminal 130*a* and the second differential signal transmission terminal 130*b* may be greater than the distance between the first signal transmission line 120*a* and the second signal transmission line 120*b* and the distance between the first pad portion Pa and the second pad portion Pb. Unless explicitly described otherwise, pads, or pad portions, as described herein, are formed of a conductive material that has a substantially flat upper and lower surface. Terms such as "same," "equal," "flat," "planar," or "coplanar," as used herein when referring to orientation, layout, location, shapes, sizes, compositions, amounts, or other measures do not necessarily mean an exactly identical orientation, layout, location, shape, size, composition, amount, or other measure, but are intended to encompass nearly identical orientation, layout, location, shapes, sizes, compositions, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially flat," may be exactly the same, equal, or flat, or may be the same, equal, or planar within acceptable variations that may occur, for example, due to manufacturing processes The connection structure 140 may electrically connect the differential signal transmission line 120 and the differential signal transmission terminal 130, and may form the aforementioned "via section" between the upper and lower surfaces of the body portion 110. The connection structure 140 may have a first connection structure 140*a* and a second connection structure 140*b* electrically connecting the first signal transmission line 120*a* and the second signal transmission line 120*b* to the first differential signal transmission terminal 130*a* and the second differential signal transmission terminal 130*b*, respectively. The first connection structure 140*a* may include first via structures 141*a* disposed to be staggered along a vertical direction (Z-axis direction), and at least one first connection line 142*a* electrically connecting the first via structures 141*a* to each other. The second connection structure 140*b* may include second via structures 141*b* disposed to be staggered along the vertical direction (Z-axis direction), and at least one second connection line 142*b* electrically connecting the second via structures 141*b* to each other. Also, the first via structures 141*a* and the second via structures 141*b* may be disposed to be spaced apart from each other in a horizontal direction (X-axis or Y-axis direction) and do not overlap in a vertical direction (Z-axis direction).

As described herein, a via refers to a conductive component that extends in a vertical direction between two conductive components (e.g., pads, pad layers, etc.) to electrically connect the two conductive components, which two conductive components are spaced apart from each other in the vertical direction and overlap in the vertical direction. As described herein, a connection line refers to a conductive component that extends horizontally and connects two conductive components which are spaced apart from each other in the horizontal direction and are formed at the same vertical level. Each via structure 141*a* described herein may be described as a stacked via set, including a via or a stack of vias that overlap in the vertical direction and that are vertically directly adjacent vias with respect to each other (e.g., with no non-vertically overlapping vias therebetween). It should be noted that the term "stacked via set" can refer to a single via or a group of vias stacked on each other.

According to an example embodiment of the present inventive concept, the connection structure 140 may be positioned between a pair of differential signal transmission terminals 130 when viewed from a vertical direction (Z-axis direction) with respect to the lower surface of the body portion 110. For example, the first connection structure 140*a* and the second connection structure 140*b* may be formed to be located in a separation space between the first differential signal transmission terminal 130*a* and the second differential signal transmission terminal 130*b* when viewed from the vertical direction (Z-axis direction). Accordingly, the differential mode may be maintained and signal loss may be effectively reduced in the "via section" between the differential signal transmission line 120 and the differential signal transmission terminal 130. In addition, at least one first connection line 142*a* between the pair of differential signal transmission terminals 130 connects the first via structures 141*a* by a shortest distance, and at least one second connection line 142*b* may be formed to connect the second via structures 141*b* by a shortest distance. For example, by densifying the first via structures 141*a* and the second via structures 141*b* between the pair of differential signal transmission terminals 130, the loss of the differential signal is reduced, and an additional routing area may be secured in the vicinity of the differential signal transmission structure DS. For example, the at least one first connection line 142*a* and the at least one second connection line 142*b* may be formed to be spaced apart and electrically insulated from each other in a vertical direction (Z-axis direction), and may be formed to intersect each other when viewed from a vertical direction (Z-axis direction). For example, at least one first connection line 142*a* and at least one second connection line 142*b* spaced apart from each other in the vertical direction (Z-axis direction) may be disposed to cross each other in a plan view (e.g., FIG. 1C), to at least partially overlap. Where a plurality of first connection lines 142*a* and a plurality of second connection lines 142*b* are used, a stack of first connection lines 142*a*, which fully overlap each other from a plan view, and which are spaced apart from each other in the vertical direction may be formed, and a stack of second connection lines 142*b*, which fully overlap each other from a plan view, and which are spaced apart from each other in the vertical direction may be formed. The stack of first connection lines 142*a* may horizontally extend in a direction that intersects a horizontal direction in which the stack of second connection lines 142*b* extend.

As described above, as the differential signal transmission structure DS of this embodiment includes a pair of connection structures 140 intersecting each other in a region formed between the pair of differential signal transmission terminals 130 from a plan view, and respectively connected to the pair of differential signal transmission lines 120, a loss of the differential signal may be significantly reduced, and a routing area within the body portion 110 may be secured. Hereinafter, components constituting the connection structure 140 of the present embodiment will be described in detail with reference to FIGS. 1B and 1C.

The pair of connection structures 140 of this embodiment may include first connection structure 140*a* and second connection structures 140*b*, which may be spaced apart from each other and electrically insulated from each other. The first connection structure 140*a* and the second connection structure 140*b* may be disposed to be staggered with respect to each other along a vertical direction (Z-axis direction). In addition, the first connection structure 140*a* may include via structures 141*a* disposed to be staggered with respect to each other in a vertical direction (Z-axis direction), and the second connection structure 140*b* may include via structures 141*b* disposed to be staggered with respect to each other in a vertical direction (Z-axis direction). For example, the first connection structure 140*a* may include first via structures 141*a* (e.g., first stacked via sets) disposed to be staggered with respect to each other along the vertical direction (Z-axis direction) and connecting the first differential signal transmission line 120*a* to the first differential signal transmission terminal 130*a*, and the second connection structure 140*b* may include second via structures 141*b* (e.g., second stacked via sets) disposed to be staggered with respect to each other along the vertical direction (Z-axis direction) and connecting the second differential signal transmission line 120*b* to the second differential signal transmission terminal 130*b*.

In the present embodiment, at least some of the via structures 141*a* and 141*b* may be disposed so as not to overlap the pair of differential signal transmission terminals 130 in the vertical direction (Z-axis direction). For example, at least a first group of the first via structures 141*a* and at least a second group of the second via structures 141*b* may be positioned between a pair of differential signal transmission terminals 130 when viewed from a vertical direction (Z-axis direction), for example, without overlapping either of the differential signal transmission terminals 130*a* or 130*b* in the vertical direction. For example, the first via structures 141*a* and the second via structures 141*b*, excluding the lowermost first via structure 141*a* and the lowermost second via structure 141*b* vertically adjacent to the pair of differential signal transmission terminals 130, may be located in a separation space between the first differential signal transmission terminal 130*a* and the second differential signal transmission terminal 130*b*, when viewed from a vertical direction. A distance d2 between the pair of differential signal transmission terminals 130 may be greater than a distance d1 between the pair of differential signal transmission lines 120 (e.g., in the X-axis direction). In this case, the distance d1 between the pair of differential signal transmission lines 120 and the distance d2 between the pair of differential signal transmission terminals 130 may be determined according to process rules. In the case in which the formation of stacked vias is limited to 2 vias or less per stacked via set (e.g., per via structure 141*a* or 141*b*), a minimum distance d1 between a pair of differential signal transmission lines 120 may be about 100 μm or more, or about 150 μm or more, for example, in a range from about 100 μm to about 500 μm, from about 100 μm to about 300 μm, from about 150 μm to about 200 μm, or the like. In addition, a minimum distance d2 between the pair of differential signal transmission terminals 130 may be at least about 200 μm or at least about 300 μm, for example, range from about 200 μm to about 1 mm, from about 200 μm to about 800 μm, from about 300 μm to about 800 μm, from about 400 μm to about 600 μm, or the like. For example, when a line width w of the pair of differential signal transmission lines 120 is about 50 μm or more and the distance d1 between the pair of differential signal transmission lines 120 is about 160 μm or more, the distance d2 between the pair of differential signal transmission terminals 130 may be in the range of about 250 μm to about 750 μm, or about 350 μm to about 650 μm. However, the distance d1 between the pair of differential signal transmission lines 120 and the distance d2 between the pair of differential signal transmission terminals 130 are not limited to the numerical ranges described above, and according to a process rule limiting the stacking of stacked vias, the distances may be formed in various ranges. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-2% deviation around 0.1 and a 0% to 2% deviation around 1, especially if such deviation maintains the same effect as the listed range.

Each via structure 141*a* may include one or more via layers VL1 and one or more pad layers PL1, and each via structure 141*b* may include one or more via layers VL2 and one or more pad layers PL2. Each via layer may comprise a via, and each pad layer may comprise a pad. As discussed herein, a via structure, also described as a stacked via set, includes a via (e.g., via layer) or a stack of vias (stack of via layers) that overlap in the vertical direction and that are directly adjacent vias with respect to each other (e.g., with no non-vertically overlapping vias therebetween). It should be noted that the term "stacked via set" can refer to a single via or a group of stacked vias. In the via structures 141*a* and 141*b* of the wiring board to which the present inventive concept is applied, the number of via layers VL1 and VL2 for each via structure may be limited to one or two layers according to a process rule. For example, a group of first via structures 141*a* may include a first first via structure 141*a* including only one via layer VL1 and a second first via structure 141*a* including two via layers VL1 stacked in the vertical direction (Z-axis direction). A group of second via structures 141*b* may include a first second via structure 141*b* including only one via layer VL2 and a second second via structure 141*b* including two via layers VL2 stacked in a vertical direction (Z-axis direction). The group of first via structures 141*a* and the group of second via structures 141*b* may be disposed, from a plan view, in a region between the pair of differential signal transmission terminals 130, and a minimum distance (e.g., in an X-axis direction, such as 'd3' in FIG. 1C) between vias of the first via structures 141*a* and the second via structures may be about 50 μm or more and about 60 μm or more. For example, the minimum distance d3 between a via of the first via structures 141a and a via of the second via structures 141b formed at the same vertical level may be in the range of about 50 μm to about 150 μm, about 50 μm to about 100 μm, about 60 μm to about 80 μm, or the like. However, the minimum distance d3 is not limited to the above-described numerical range, and may be formed in various ranges according to design. Each first pad layer PL1 and each second pad layer PL2 may be respectively disposed above and/or below each first via layer VL1 and each second via layer VL2, and may interconnect vias at different first and second via layers VL1 and VL2, or may connect the first and second via layers VL1 and VL2 to the first and second differential signal transmission lines 120a and 120b or the first and second connection lines 142a and 142b. As can be seen from above, ordinal numbers such as "first," "second," "third," etc. may be used simply as labels of certain elements, steps, etc., to distinguish such elements, steps, etc. from one another. Also, terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

The first via structures 141a may be disposed to be staggered according to a process rule. The second via structures 141b may also be disposed to be staggered according to a process rule. For example, the first via structures 141a may be alternately disposed on a first axis X1 and a second axis X2 extending in the vertical direction (Z-axis direction), between the pair of differential signal transmission terminals 130, and spaced apart from each other in the horizontal direction (X-axis or Y-axis direction, or a diagonal direction with respect to the X-axis and Y-axis), and may be electrically connected to each other through the first connection lines 142a. In addition, the second via structures 141b may be alternately disposed on a third axis X3 and a fourth axis X4, extending in the vertical direction (Z-axis direction), between the pair of differential signal transmission terminals 130, and spaced apart from each other in the horizontal direction (X-axis or Y-axis direction, or a diagonal direction with respect to the X-axis and Y-axis), and may be electrically connected to each other through the second connection lines 142b. In this case, the first axis X1 refers to an axis disposed adjacent to and closer to the pair of differential signal transmission lines 120 than the second axis X2, and the third axis X3 refers to an axis disposed adjacent to and closer to the pair of differential signal transmission lines 120 than the fourth axis X4.

In addition, the first via structures 141a may include one or more first via layers VL1 and first pad layers PL1 overlapping the first axis X1 or the second axis X2, respectively, and the second via structures 141b may include one or more second via layers VL2 and second pad layers PL2 overlapping the third axis X3 or the fourth axis X4, respectively. In this case, at least some of the first via structures 141a and the second via structures 141b may include two or more consecutive adjacent first via layers VL1 or second via layers VL2 stacked along the first axis X1, the second axis X2, the third axis X3, or the fourth axis X4.

The first axis X1, the second axis X2, the third axis X3, and the fourth axis X4 may respectively be virtual axes passing through the first via layers VL1 or the second via layers VL2. For example, the first via layers VL1 are stacked along the first axis X1 or the second axis X2, and the first via layers VL1 and the first pad layers PL1 disposed on the same axis on the XY plane may overlap each other. Similarly, the second via layers VL2 are stacked along the third axis X3 or the fourth axis X4, and the second via layers VL2 and the second pad layers PL2 disposed on the same axis on the XY plane may overlap each other. The first axis X1, the second axis X2, the third axis X3, and the fourth axis X4 may extend so as not to overlap either terminal of the pair of differential signal transmission terminals 130 in the vertical direction (Z axis direction). However, via layers or pad layers disposed on the same axis may not completely overlap physically. For example, only some regions of the first via layers VL1 or the first pad layers PL1 may overlap, unlike those illustrated in FIG. 1C. In detail, the first axis X1, the second axis X2, the third axis X3, and the fourth axis X4 are respective axes serving as an alignment reference for the first via layers VL1 or the second via layers VL2, and may not match exactly with the central axis of the first via layers VL1 or the second via layers VL2.

At least some of each of the first via structures 141a and the second via structures 141b may be positioned to overlap the pair of differential signal transmission terminals 130. For example, a lowermost first via structure 141a may be disposed on the fifth axis X5 extending in the vertical direction (Z-axis direction) within the first differential signal transmission terminal 130a, and a lowermost second via structure 141b may be disposed on the sixth axis X6 extending in the vertical direction (Z-axis direction) within the second differential signal transmission terminal 130b. The fifth axis X5 and the sixth axis X6 may extend to overlap the pair of differential signal transmission terminals 130 in a vertical direction (Z-axis direction).

In this embodiment, the first axis X1, the second axis X2, the third axis X3, and the fourth axis X4 may be disposed such that at least one first connection line 142a and at least one second connection line 142b cross each other when viewed from the vertical direction (Z-axis direction). For example, a pair of differential signal transmission lines 120 may be cross-connected to a corresponding pair of differential signal transmission terminals 130. For the first via structures other than the one immediately adjacent the first differential signal transmission terminal 130a in the Z-axis direction, a first connection line 142a may connect the lowermost first pad layer PL1 of a first via structure 141a disposed on the first axis X1 to the uppermost first pad layer PL1 of an adjacent first via structure 141a disposed on the second axis X2 to each other. For the second via structures other than the one immediately adjacent the second differential signal transmission terminal 130b in the Z-axis direction, a second connection line 142b may connect the lowermost second pad layer PL2 of a second via structure 141b disposed on the third axis X3 to the second uppermost pad layer PL2 of an adjacent second via structure 141b disposed on the fourth axis X4 to each other. The first connection lines 142a and the second connection lines 142b are spaced apart from each other in the vertical direction (Z-axis direction) and may be located on different vertical levels.

Hereinafter, components of the wiring board 100 excluding the differential signal transmission structure DS described above will be described with reference to FIGS. 2A and 2B.

Figure 2A:
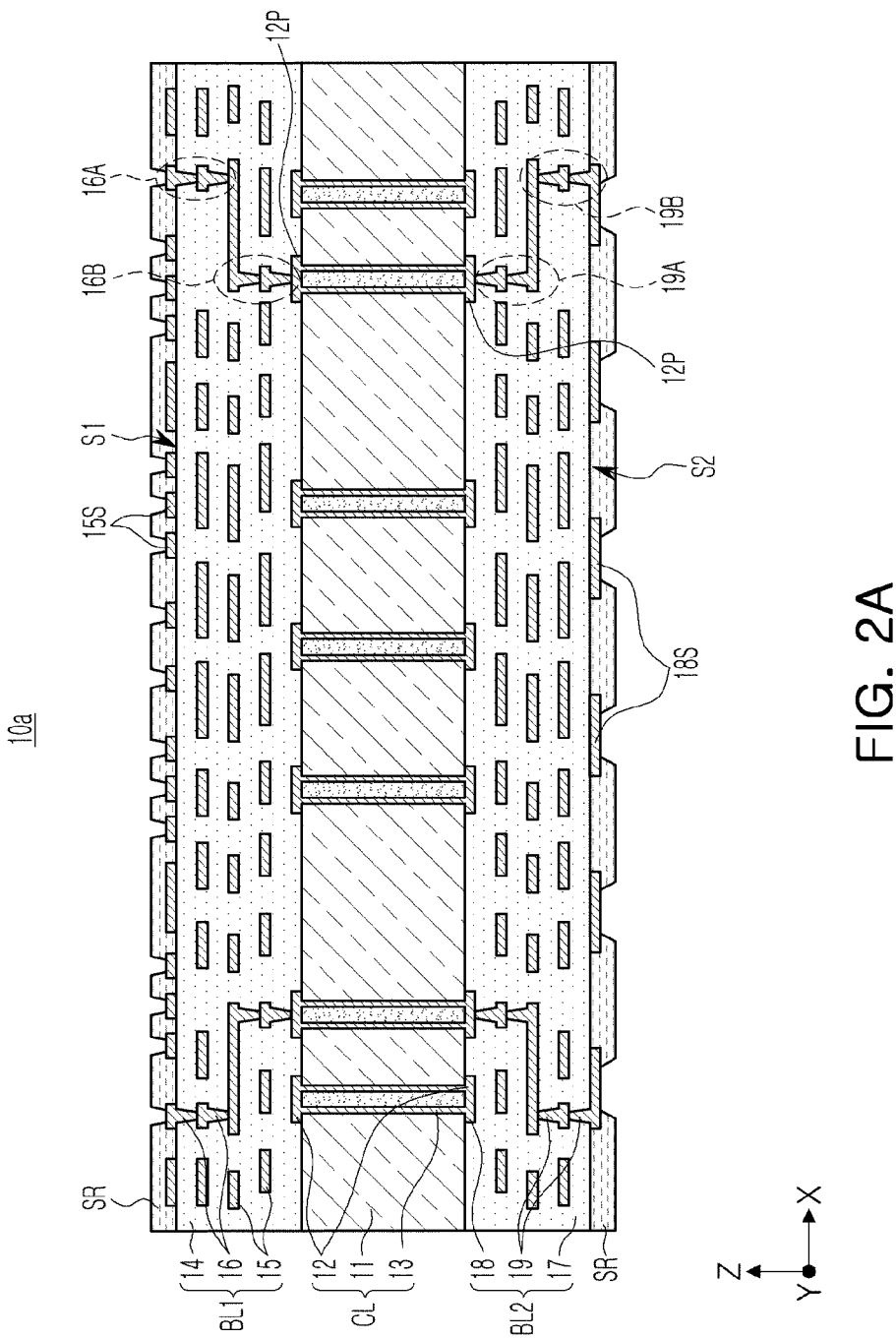
FIGS. 2A and 2B are cross-sectional views respectively illustrating an example of a wiring board to which the differential signal transmission structure of FIG. 1A may be applied.
Figure 2B:
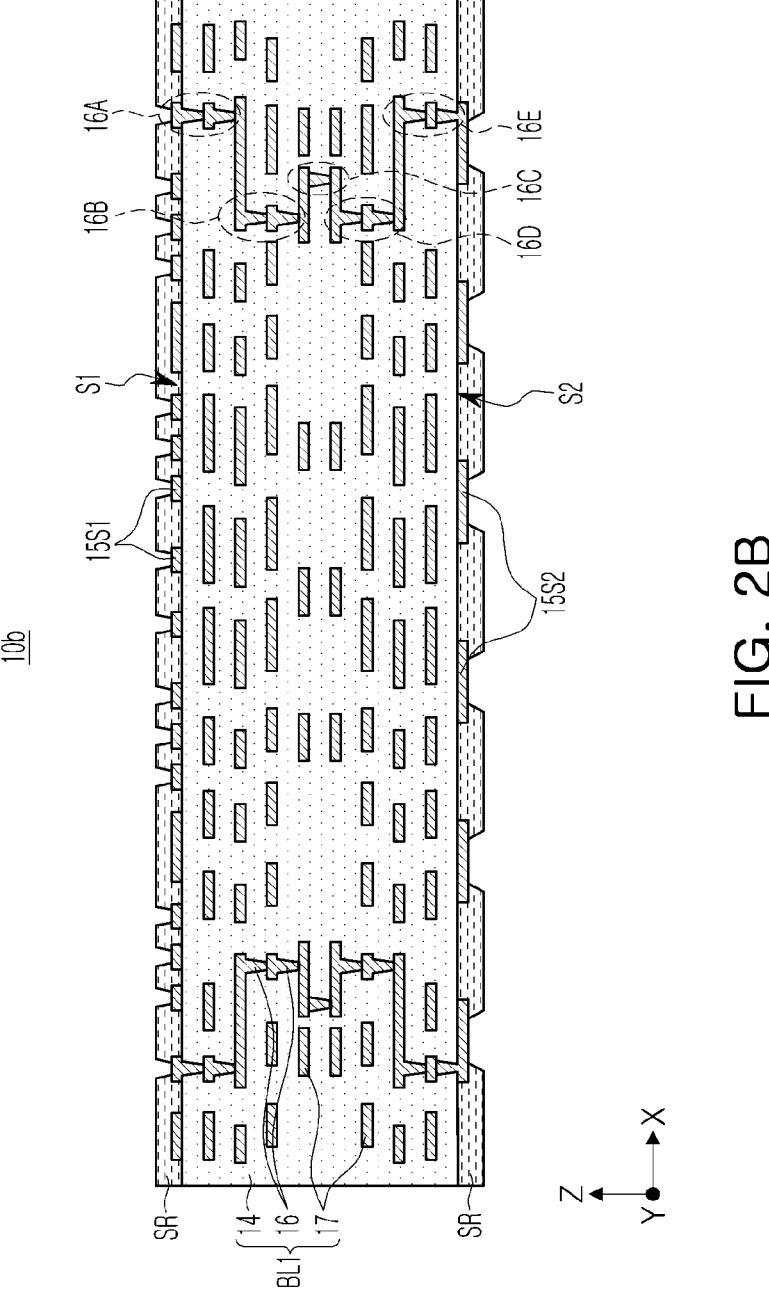

FIGS. 2a and 2b are cross-sectional views respectively illustrating examples of wiring boards 10a and 10b to which the differential signal transmission structure DS of FIG. 1A may be applied.

Referring to FIG. 2A, the wiring board 10a according to an example embodiment may have an upper surface S1 and a lower surface S2 opposing each other, and may include a core substrate portion CL, an upper substrate portion BL1, a lower substrate portion BL2, and a protective layer SR. However, the wiring board 10a according to an example may include only one or two selected from the core substrate portion CL, the upper substrate portion BL1, and the lower substrate portion BL2. For example, like a wiring board ('10b' in FIG. 2B) according to another example to be described later, it should be noted in advance that the core substrate portion CL and the lower substrate portion BL2 are optional additional components that may be omitted.

The core substrate portion CL may include a core insulating layer 11, core wiring patterns 12 disposed on both surfaces (upper and lower surfaces) of the core insulating layer 11, and a core via 13 passing through the core insulating layer 11 and connecting the core wiring patterns 12 to each other. The core substrate portion CL may have a multilayer core substrate structure in which a plurality of core insulating layers 11 are stacked according to design.

The core insulating layer 11 may suppress warpage of the substrate by improving rigidity of the substrate. The thickness of the core insulating layer 11 may be greater than the thickness of each of an upper build-up insulating layer 14 and a lower build-up insulating layer 17. The core insulating layer 11 may include or be formed of an insulating material, for example, a thermosetting resin such as an epoxy resin, a thermoplastic resin such as polyimide, or ABF, FR-4, or a prepreg including an inorganic filler and/or glass fiber. The core insulating layer 11 may be formed using, for example, a copper clad laminate (CCL), an unclad copper clad laminate (Unclad CCL), a glass substrate, a ceramic substrate, or the like.

The core wiring patterns 12 may include or be formed of a conductive material, for example, an alloy including at least one metal or two or more metals among copper (Cu), aluminum (Al), nickel (Ni), silver (Ag), gold (Au), platinum (Pt), tin (Sn), lead (Pb), titanium (Ti), chromium (Cr), palladium (Pd), indium (In), zinc (Zn) and carbon (C). The core wiring patterns 12 may include or may be a ground pattern, a power pattern, a signal pattern, and the like according to design.

The core via 13 may be formed as the via hole passing through the core insulating layer 11 is completely filled with the conductive material or as the conductive material is conformally formed along the wall of the via hole. For example, when the core via 13 is formed as a conductive material is formed along the wall of the via hole, the space inside the via hole may be filled with an insulating material such as an epoxy resin.

The upper substrate portion BL1 may include the upper build-up insulating layer 14 laminated on the upper surface of the core insulating layer 11, an upper wiring pattern 15 disposed on the upper build-up insulating layer 14, and an upper wiring via 16 passing through the upper build-up insulating layer 14 to connect the upper wiring pattern 15 and the core wiring pattern 112.

The upper build-up insulating layer 14 may have a structure in which a plurality of insulating layers formed of an insulating material are stacked in a vertical direction (Z-axis direction). The plurality of insulating layers may be integrated so that the boundary between the plurality of insulating layers may not be clear. The insulating material may include or may be, for example, a thermosetting resin such as an epoxy resin, a thermoplastic resin such as polyimide, or a prepreg, ABF or FR-4 including an inorganic filler and/or glass fiber.

The upper wiring pattern 15 may include a plurality of upper wiring patterns 15 positioned at different levels (e.g., vertical levels). The upper wiring pattern 15 may be electrically connected to at least one of a core wiring pattern 12 and a lower wiring pattern 18. The upper wiring pattern 15 may include a ground pattern, a power pattern, a signal pattern, or the like, similarly to the core wiring pattern 12. The upper wiring pattern 15 may include or be formed of one of the aforementioned conductive materials.

Each upper wiring via 16 penetrates through at least a portion of the upper build-up insulating layer 14 to connect upper wiring patterns 15 located on different layers or the upper wiring pattern 15 and the core wiring pattern 12 to each other. Each upper wiring via 16 may include or be formed of a conductive material similar to that of the upper interconnection pattern 15. Each upper wiring via 16 may have a form of a filled via in which a metal material is filled in the via hole or a conformal via in which a metal material is formed along an inner wall of the via hole.

The lower substrate portion BL2 may include a lower build-up insulating layer 17 laminated on the lower surface of the core insulating layer 11, a lower wiring pattern 18 disposed on the lower build-up insulating layer 17, and a lower wiring via 19 passing through the lower build-up insulating layer 17 and connecting the lower wiring pattern 18 and the core wiring pattern 12. Since the lower substrate portion BL2 has similar characteristics to the upper substrate portion BL1, a description of the lower build-up insulating layer 17, the lower wiring pattern 18, and the lower wiring via 19 will be omitted. The lower substrate portion BL2 may have a symmetrical structure with the upper substrate portion BL1 with respect to the core substrate portion CL (e.g., to be mirror-symmetric). For example, both the lower wiring via 19 and the upper wiring via 16 may have a tapered shape in which widths decrease toward the core substrate portion CL. Accordingly, the lower wiring via 19 and the upper wiring via 16 may have shapes tapered in opposite directions.

The protective layer SR may be disposed on the upper substrate portion BL1 and the lower substrate portion BL2, respectively. The protective layer SR may have an opening exposing at least a portion of the uppermost upper wiring pattern 15S and the lowermost lower wiring pattern 18S. The protective layer SR may include or be formed of one of the above-described insulating materials. For example, the protective layer SR may be formed using a solder resist. It should be noted that items described in the singular (e.g., an opening, and various other items described previously and below) may be provided in plural, as can be readily seen in the figures.

In the case of the upper wiring vias 16 and the lower wiring vias 19, the number of vertically aligned and adjacent stacked vias may be limited to 2 or less by process rules, and adjacent via structures may be disposed to be staggered from each other. For example, the upper substrate portion BL1 may include a first upper via structure 16A and a second upper structure 16B in which two upper wiring vias 16 are stacked, and the lower substrate portion BL2 may include a first lower via structure 19A and a second lower via structure 19B in which two lower wiring vias 19 are stacked. In this case, along the vertical direction (Z-axis direction), the first upper via structure 16A may be disposed to be staggered from (e.g. horizontally offset from) the second upper via structure 16B, and the first lower via structure 19A may be disposed to be staggered from (e.g., horizontally offset from) the second lower via structure 19B. In the drawing, the second upper via structure 16B and the first lower via structure 19A adjacent to the core substrate portion CL are stacked directly on a landing pad 12P on the core via 13, but according to an example embodiment, one or both of the second upper via structure 16B and the first lower via structure 19A adjacent to the core substrate portion CL may be disposed to be staggered from the core via 13. The stack limit of the via described above by the process rule may refer to the number of the upper wiring vias 16 in a stack or the number of lower wiring vias 19 in a stack, excluding the core via 13 or the number of stacked vias including the core via 13.

In this case, the core via 13, the upper wiring vias 16, and the lower wiring vias 19 may provide the 'via section' or the connection structure 140 described with reference to FIGS. 1A to 1C. For example, the uppermost upper wiring pattern 15S disposed on the upper surface S1 of the wiring board 1*a* may provide a pair of differential signal transmission lines (120 in FIG. 1A), the lowest lower wiring pattern 18S disposed below the lower surface S2 of the wiring board 1*a* may provide a pair of differential signal transmission terminals (130 in FIG. 1A), and the core via 13, the upper wiring vias 16, the lower wiring vias 19 and the like between the upper surface S1 and the lower surface S2 of the wiring board 1*a* may provide a pair of connection structures 140. Additional vias 16 and 19 not shown may connect to another core via 13 and may be staggered along the Z-axis in the Y-axis direction to form the second part of the differential signal transmission line. The protective layer SR may be formed to cover at least a portion of the pair of differential signal transmission terminals '130 of FIG. 1A and/or the pair of differential signal transmission terminals ('130 of FIG. 1A). In some embodiments, the protective layer SR may be formed in a non solder mask defined (NSMD) structure that completely exposes pads of the uppermost upper wiring pattern 15S and the lowermost lower wiring pattern 18S.

Referring to FIG. 2B, the wiring board 10*b* of an illustrative example embodiment may not include the core substrate portion CL and the lower substrate portion BL2. The wiring board 10*b* may include only the upper substrate portion BL1 stacked in one direction. In the upper wiring vias 16, the number of consecutively vertically stacked vias is limited to two or less by process rules, and adjacent via structures may be staggered from each other. For example, the upper substrate portion BL1 may include first to fifth upper via structures 16A, 16B, 16C, 16D, and 16E in which one or two upper wiring vias 16 are stacked. In this case, the first to fifth upper via structures 16A, 16B, 16C, 16D, and 16E adjacent along the vertical direction (Z-axis direction) may be disposed to be staggered from each other. In the drawing, although the first upper via structure 16A and the third upper via structure 16C that are not adjacent to each other are also disposed to be staggered from each other, the present inventive concept is not limited thereto. According to an example embodiment, the first upper via structure 16A, the third upper via structure 16C, and the fifth upper via structure 16E may be disposed to overlap in a vertical direction (Z-axis direction). The first to fifth upper via structures 16A, 16B, 16C, 16D, and 16E may provide the 'via section' or the connection structure 140 described with reference to FIGS. 1A to 1C. For example, the uppermost upper wiring pattern 15S1 disposed on the upper surface S1 of the wiring board 1*b* may provide a pair of differential signal transmission lines (120 in FIG. 1A), the lowest lower wiring pattern 15S2 disposed below the lower surface S2 of the wiring board 1*b* may provide a pair of differential signal transmission terminals (130 in FIG. 1A), and the first to fifth upper via structures 16A, 16B, 16C, 16D, 16E and the like between the upper surface S1 and the lower surface S2 of the wiring board 1*b* may provide a pair of connection structures 140.

The staggered arrangement disclosed herein may also be described in some cases as a zig-zag arrangement, as being alternately disposed with respect to each other, or as square wave pattern arrangement. Two differential signal transmission lines may be arranged, so that a first differential signal transmission line has staggered via structures that form a square wave shape that is parallel to a first plane, and a second differential signal transmission line has staggered via structures that form a square wave pattern that is parallel to a second plane that intersects the first plane. Both the first plane and the second plane may extend in a vertical direction.

Figure 3A:
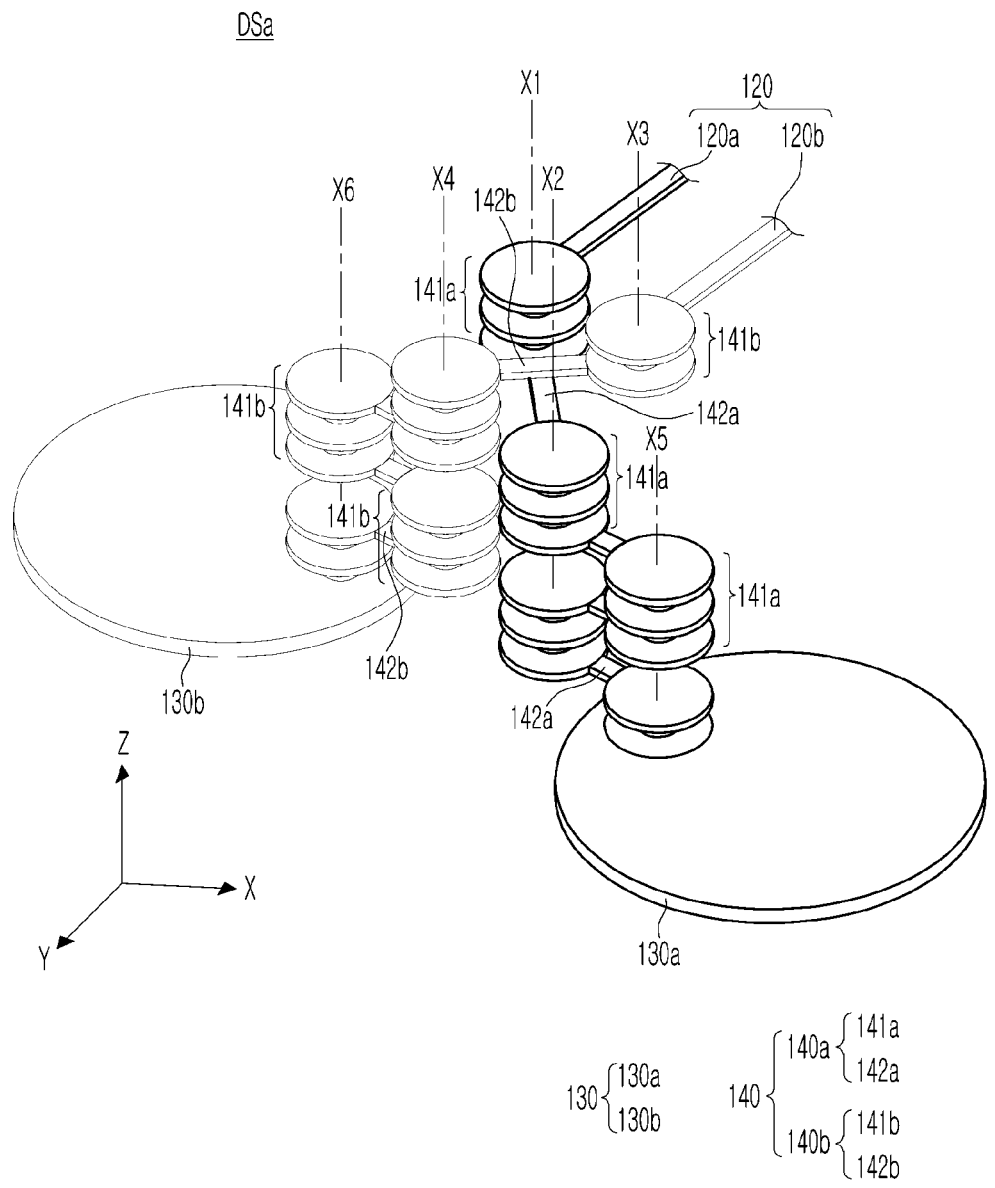
FIG. 3A is a perspective view illustrating a differential signal transmission structure according to an illustrative modification.
Figure 3B:
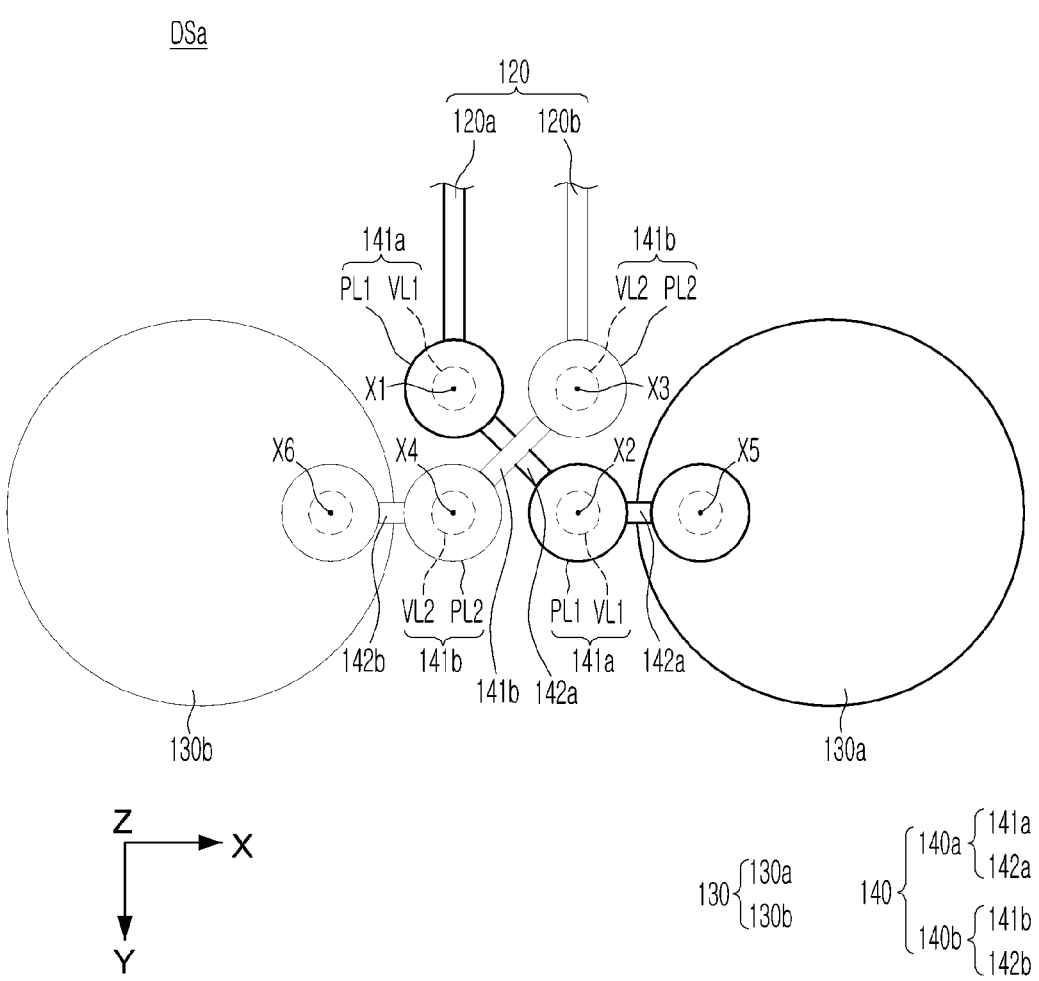
FIG. 3B is a plan view of the differential signal transmission structure of FIG. 3A.

FIG. 3A is a perspective view illustrating a differential signal transmission structure DSa according to an illustrative modification, and FIG. 3B is a plan view of the differential signal transmission structure DSa of FIG. 3A.

Referring to FIGS. 3A and 3B, the differential signal transmission structure DSa of the modified example may have the same or similar characteristics as those described with reference to FIGS. 1A to 2B, except for including a plurality of first via structures 141*a* and a plurality of second via structures 141*b* overlapping the pair of differential signal transmission terminals 130. In this modified example, two or more first via structures 141*a* may be disposed on the fifth axis X5 overlapping the first differential signal transmission terminal 130*a*, and two or more second via structures 141*b* may be disposed on the sixth axis X6 overlapping the second differential signal transmission terminal 130*b*. Some of the first via structures 141*a* may form a square wave shape along a vertical plane, and some of the second via structures 141*b* may form a square wave shape along the same vertical plane. At least one first connection line 142*a* connecting the first via structure 141*a* on the second axis X2 to the first via structure 141*a* on the fifth axis X5 (e.g., at least one first connection line 142*a* that is part of the square wave shape) may not cross at least one second connection line 142*b* connecting the second via structure 141*b* on the fourth axis X4 to the second via structure 141*b* on the sixth axis X6 (e.g., at least one second connection line 142*b* that is part of the square wave shape). In this manner, the routing area around the differential signal transmission structure DSa may be designed by changing the positions of the first via structures 141*a* and the second via structures 141*b*. However, even in this case, the remaining first via structures 141*a* and second via structures 141*b* except for the first via structures 141*a* and the second via structures 141*b* on the fifth axis X5 or the sixth axis X6 may be disposed so as not to overlap the pair of differential signal transmission terminals 130.

Figure 4A:
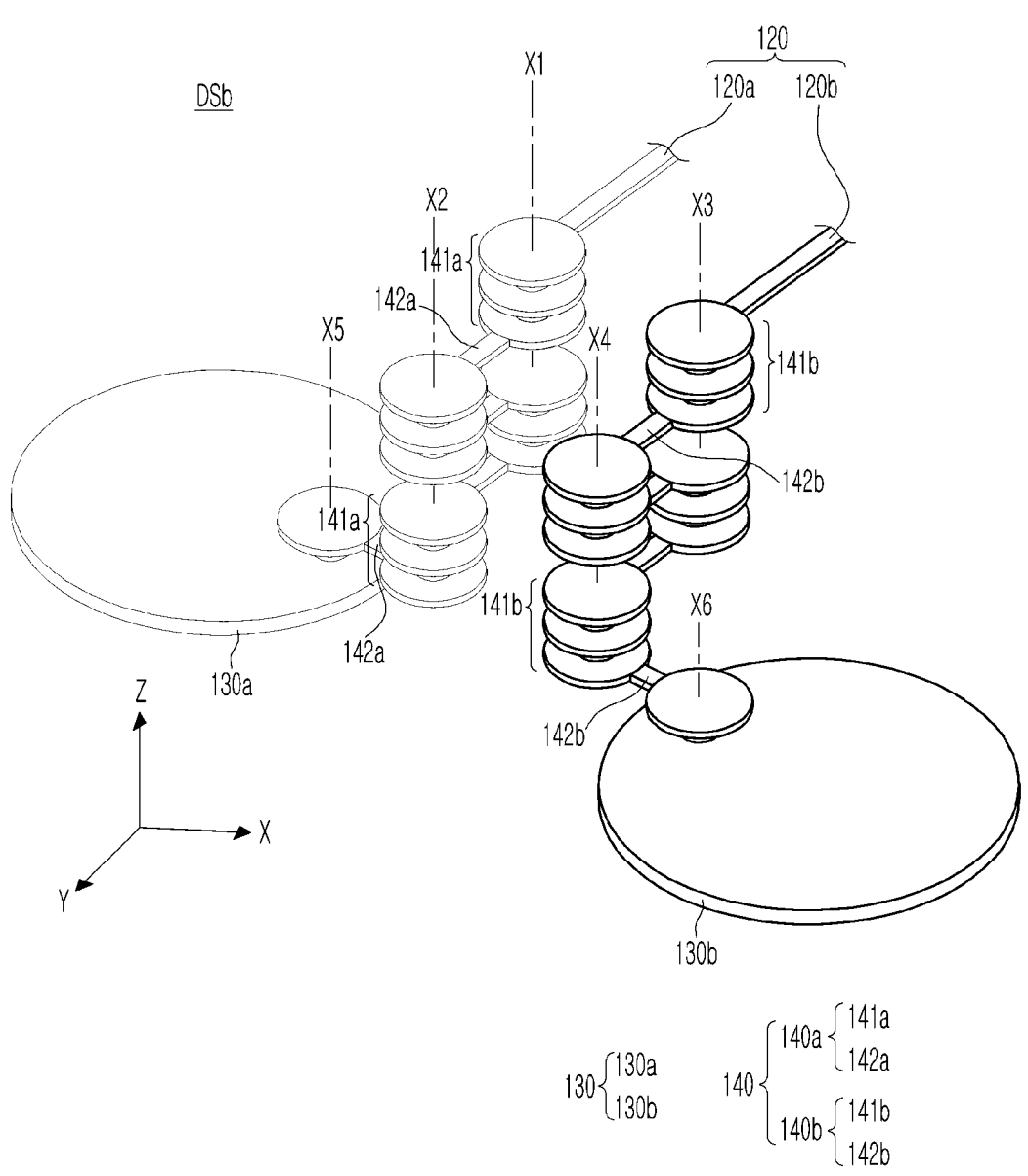
FIG. 4A is a perspective view illustrating a differential signal transmission structure according to an illustrative modification.
Figure 4B:
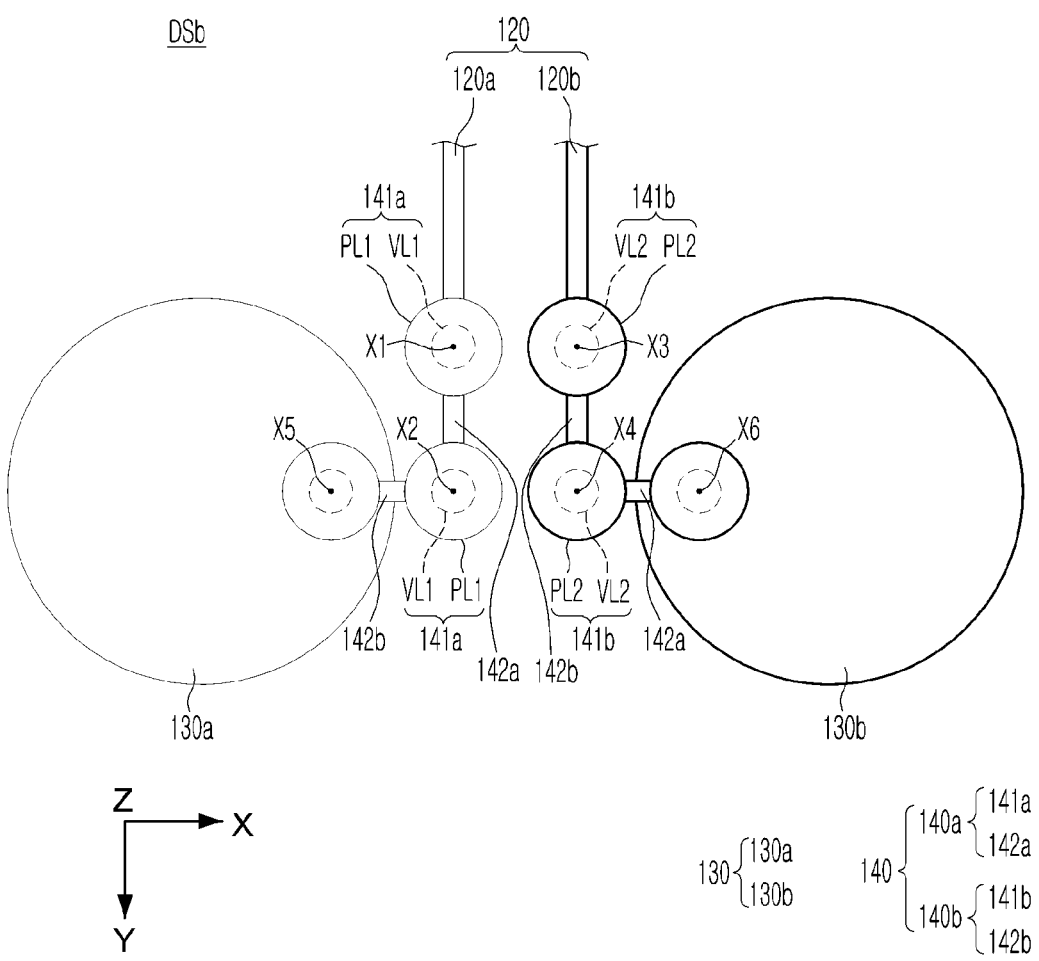
FIG. 4B is a plan view of the differential signal transmission structure of FIG. 4A.

FIG. 4A is a perspective view illustrating a differential signal transmission structure DSb according to an illustrative modification, and FIG. 4B is a plan view of the differential signal transmission structure DSb of FIG. 4A.

Referring to FIGS. 4A and 4B, the differential signal transmission structure DSb of a modified example may have the same or similar characteristics as those described with reference to FIGS. 1A to 3B, except that the at least one first connection line 142*a* and the at least one second connection line 142*b* do not cross between the pair of differential signal transmission terminals 130. In this modified example, the first axis X1, the second axis X2, the third axis X3, and the fourth axis X4 may be disposed such that the at least one first connection line 142*a* and the at least one second connection line 142*b* do not cross when viewed from the vertical direction (Z-axis direction). In this manner, by designing the first connection structure 140a and the second connection structure 140b not to cross, at least one first connection line 142a and at least one second connection line 142b may be formed with a shortest distance, and impedances of the first connection structure 140a and the second connection structure 140b may be effectively matched. However, even in this case, the first via structures 141a and the second via structures 141b on the first axis X1, the second axis X2, the third axis X3, and the fourth axis X4 may be disposed so as not to overlap the pair of differential signal transmission terminals 130.

Figure 5A:
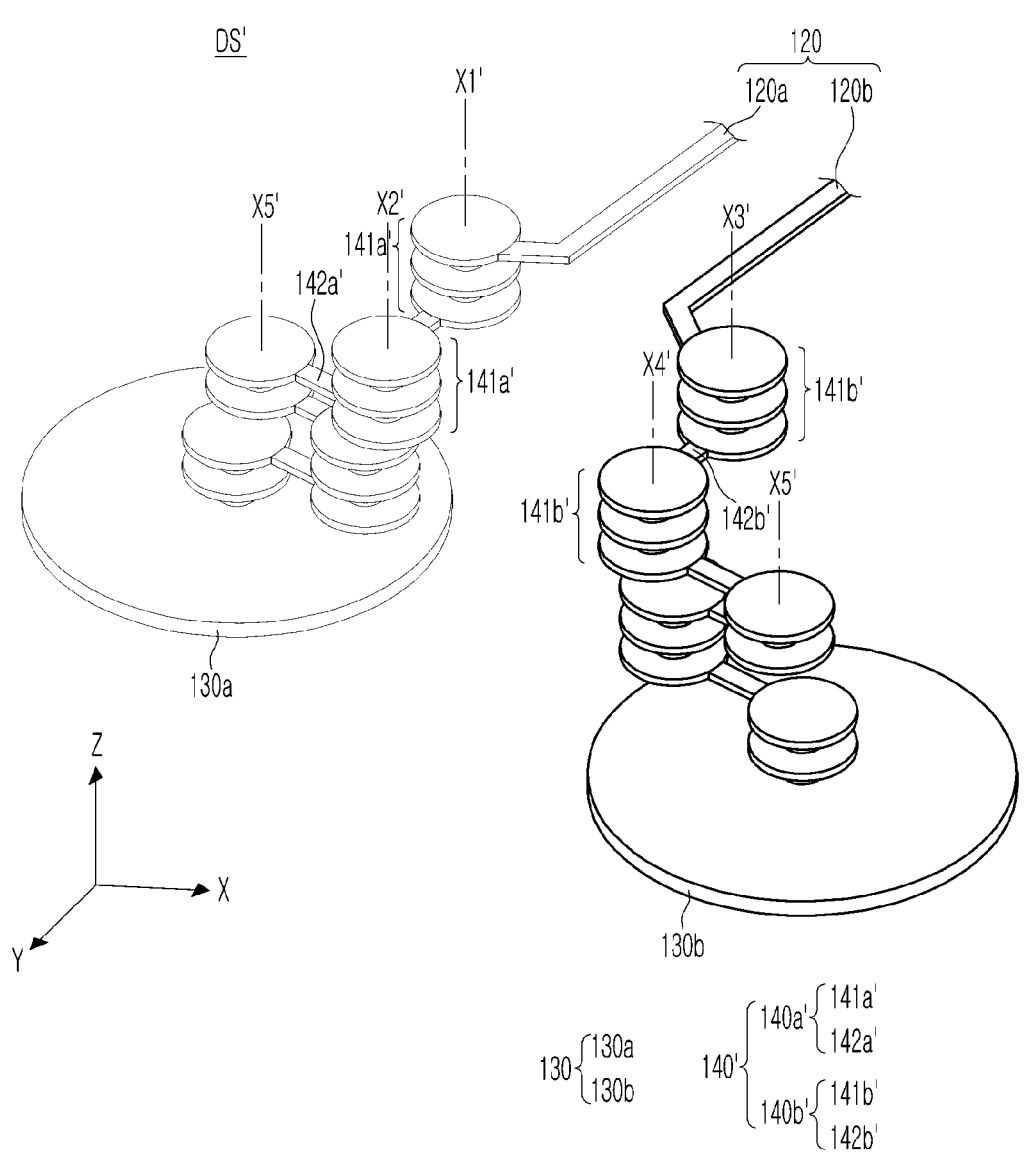
FIG. 5A is a perspective view illustrating a differential signal transmission structure according to an illustrative comparative example.
Figure 5B:
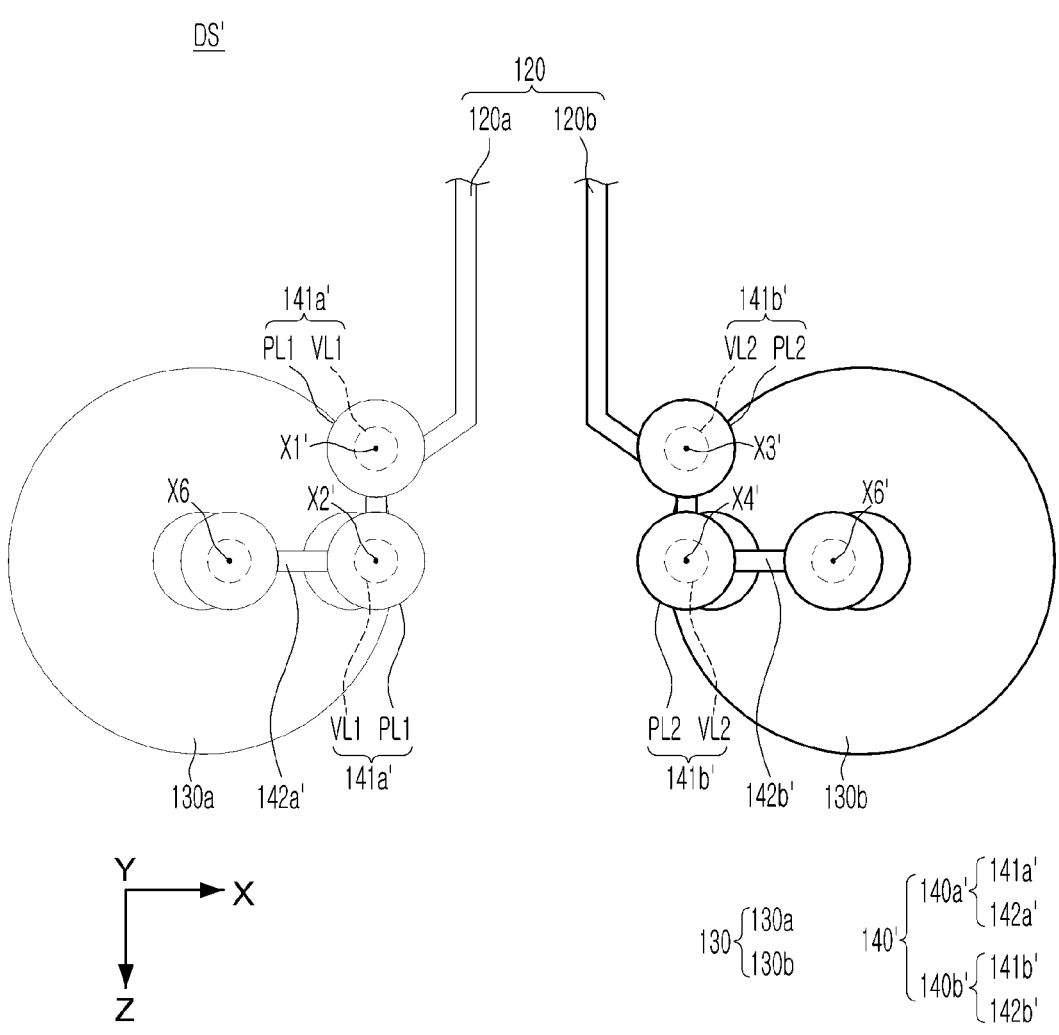
FIG. 5B is a plan view of the differential signal transmission structure of FIG. 5A.

FIG. 5A is a perspective view illustrating a differential signal transmission structure DS' according to an illustrative comparative example, and FIG. 5B is a plan view of the differential signal transmission structure DS' of FIG. 5A.

Referring to FIGS. 5A and 5B, the differential signal transmission structure DS' of the comparative example may include a pair of connection structures 140' symmetrically formed on the first differential signal transmission terminal 130a and the second differential signal transmission terminal 130b according to a process rule limiting the stacked vias. The pair of connection structures 140' may include a first connection structure 140a' overlapping the first differential signal transmission terminal 130a in a vertical direction (Z-axis direction), and a second connection structure 140b' overlapping the second differential signal transmission terminal 130b in the vertical direction (Z-axis direction). The first connection structure 140a' includes first via structures 141a' alternately disposed on the first axis X1' of the comparative example and the second axis X2' of the comparative example, and the first axis X1' of the comparative example and/or the second axis X2' of the comparative example may overlap a first differential signal transmission terminal 130a in the vertical direction (Z-axis direction). The second connection structure 140b' includes second via structures 141b' alternately disposed on the third axis X3' of the comparative example and the fourth axis X4' of the comparative example, and the third axis X3' of the comparative example and/or the fourth axis X4' of the comparative example may overlap the second differential signal transmission terminal 130b in the vertical direction (Z-axis direction). At least one first connection line 142a' and at least one second connection line 142b' do not cross each other (e.g., none of the first connection lines 142a' cross any of the second connection lines 142b'), and may overlap the first differential signal transmission terminal 130a and the second differential signal transmission terminal 130b, respectively.

Hereinafter, a difference in electrical characteristics between the differential signal transmission structure DS' of the comparative example and the differential signal transmission structure DS according to an example embodiment of the present inventive concept will be described with reference to FIGS. 6A and 6B.

Figure 6A:
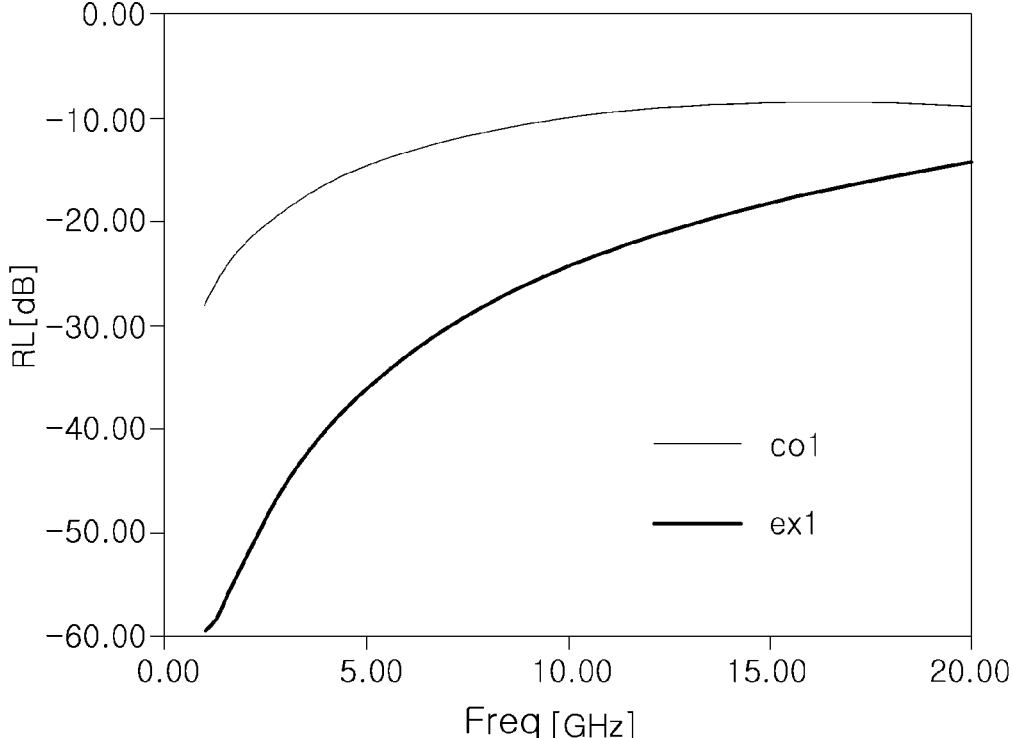
FIG. 6A is a graph illustrating the difference in return loss (RL) between a differential signal transmission structure of an example embodiment and a differential signal transmission structure of a comparative example.
Figure 6B:
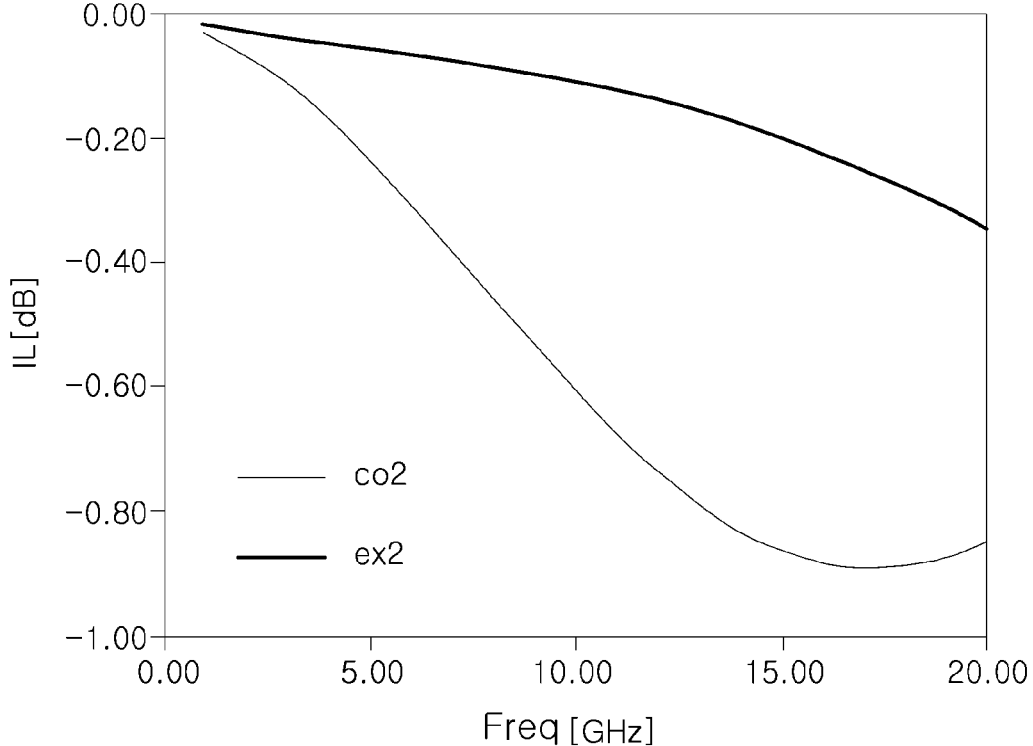
FIG. 6b is a graph illustrating the difference in insertion loss (IL) between a differential signal transmission structure of an example embodiment and a differential signal transmission structure of a comparative example.

FIG. 6A is a graph illustrating the difference in return loss (RL) according to a frequency (Freq) of the differential signal transmission structure DS of an example embodiment and the differential signal transmission structure DS' of the comparative example, and FIG. 6B is a graph illustrating a difference in insertion loss (IL) according to a frequency Freq of the differential signal transmission structure DS of an example embodiment and the differential signal transmission structure DS' of the comparative example.

Referring to FIGS. 6A and 6B, a return loss ex1 of the differential signal according to an example embodiment of the present inventive concept was reduced by about 15 dB or more at a frequency of about 10 GHz or less, compared with the return loss (co1) of the comparative example, and even at higher frequencies (e.g., about 20 GHz), the return loss was reduced by about 5 dB. In addition, an insertion loss ex2 of the differential signal according to an example embodiment of the present inventive concept was reduced by about 0.5 dB or more at a frequency of about 10 GHz or more, compared with the insertion loss (co2) of the comparative example. For example, in the differential signal transmission structure (DS' in FIG. 1A) according to an example embodiment, by forming a "via section" (referring to a differential signal transmission section formed of a connection structure (140' in FIG. 1A)) between the differential signal transmission terminals (130' in FIG. 1A), a loss of the differential signal may be effectively reduced. In this case, the return loss ex1 and the insertion loss ex2 of an example embodiment were measured for the differential signal transmission structure DS illustrated in FIGS. 1B and 1C, and the return loss (co1) and insertion loss (co2) of the comparative example were measured for the differential signal transmission structure DS' illustrated in FIGS. 5A and 5B.

Figure 7:
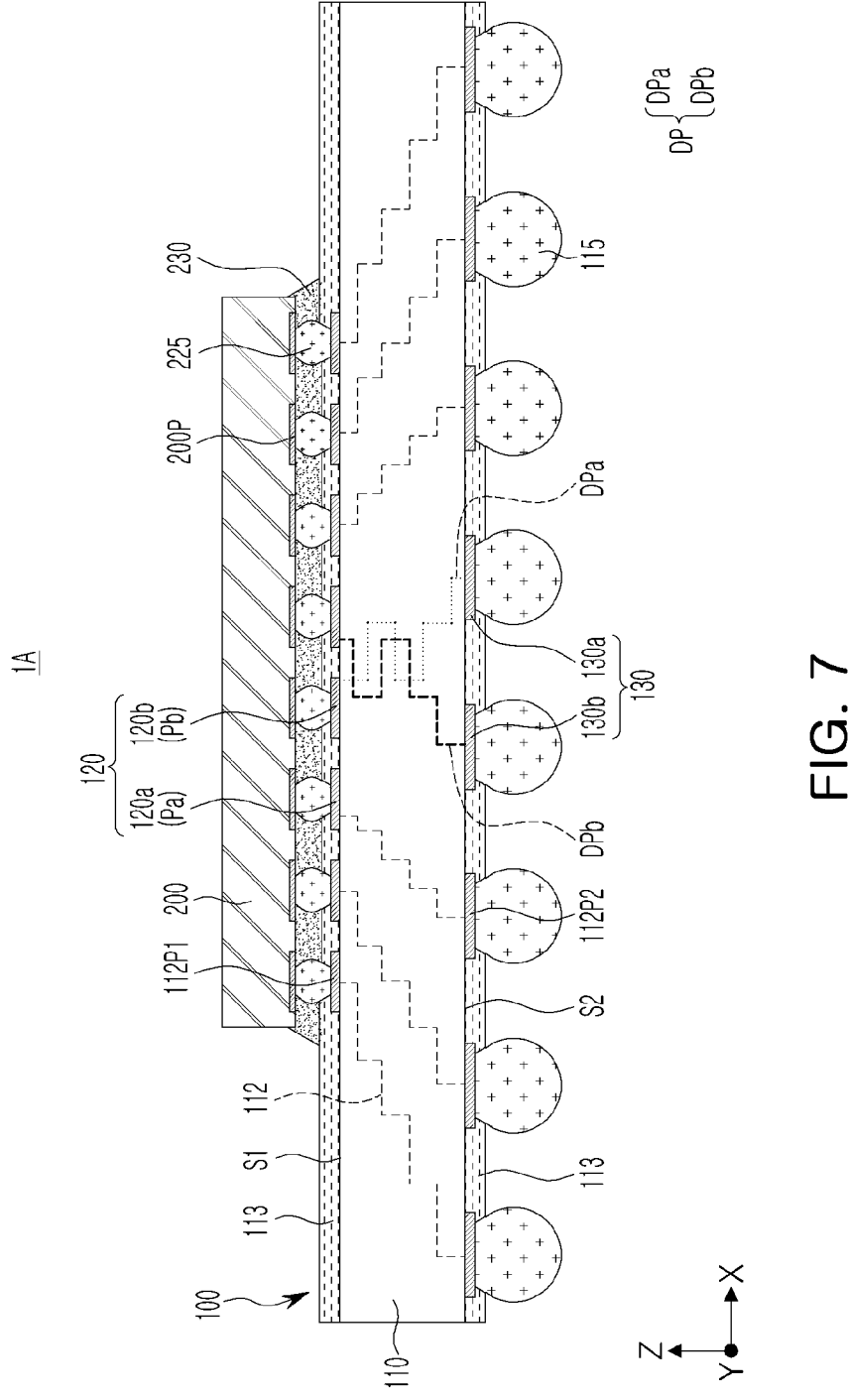
FIG. 7 is a cross-sectional view illustrating a semiconductor package according to an example embodiment.

FIG. 7 is a cross-sectional view illustrating a semiconductor package 1A according to an example embodiment.

Referring to FIG. 7, the semiconductor package 1A according to an example embodiment may include a wiring board 100 and a semiconductor chip 200 mounted on the wiring board 100.

The wiring board 100 may include a body portion 110 having an upper surface S1 and a lower surface S2 opposing each other, a wiring circuit 112 forming an electrical path in the body portion 110, and cover layers 113 disposed on the upper surface S1 and the lower surface S2 of the body portion 110, respectively. The wiring board 100 of this embodiment may have the same or similar characteristics to the wiring boards 10a and 10b described with reference to FIGS. 2A and 2B. For example, the body portion 110 may be provided by the core insulating layer 11, the upper build-up insulating layer 14, and/or the lower build-up insulating layer 17 of FIGS. 2A and 2B, and the wiring circuit 112 may be provided by the core wiring pattern 12, the core via 13, the upper wiring pattern 15, the upper wiring via 16, the lower wiring pattern 18, and the lower wiring via 19 of FIGS. 2A and 2B. Also, the cover layer 113 may correspond to the protective layer SR of FIGS. 2A and 2B.

The wiring board 100 may include at least one pair of differential signal transmission paths DP formed of the differential signal transmission structures DS, DSa, and DSb described with reference to FIGS. 1A to 4B. To illustrate the twisted form of the first differential signal transmission path DPa and the second differential signal transmission path DPb on the side cross-sectional view of the semiconductor package 1A, the first differential signal transmission path DPa is illustrated by a dotted line, and the second differential signal transmission path DPb is illustrated by a dashed line. However, according to example embodiments, the first differential signal transmission path DPa and the second differential signal transmission path DPb may be formed so as not to intersect each other (refer to the example embodiment of FIGS. 4A and 4B). A pair of differential signal transmission paths (DP) may include a first differential signal transmission path DPa connecting the first differential signal transmission line 120a and the first differential signal transmission terminal 130a, and a second differential signal transmission path DPb connecting the second differential signal transmission line 120b and the second differential signal transmission terminal 130b. A vertically extended portion of the pair of differential signal transmission paths (DP) may be understood as corresponding to the first and second via structures (141a' and '141b' in FIG. 1A), and a horizontally extended portion may be understood as corresponding to the first and second connection lines (142a' and '142b' in FIG. 1A).

A pair of differential signal transmission paths DP may be provided by the wiring circuit 112. For example, the wiring circuit 112 has first pads 112P1 disposed on the upper surface S1 of the body portion 110 and second pads 112P2 disposed on the lower surface S2 of the body portion 110, and at least a portion of the first pads 112P1 may provide a first pad portion Pa and a second pad portion Pb through which a differential signal is transmitted from the semiconductor chip 200. At least a portion of the second pads 112P2 may provide a pair of differential signal transmission terminals 130 positioned on one end of the differential signal transmission path DP. The differential signal transmitted from a connection pad 200P of the semiconductor chip 200 may reach the pair of differential signal transmission terminals 130 via the differential signal transmission path DP and a pair of differential signal transmission lines 120 including a first pad portion Pa and a second pad portion Pb.

Respective external connection bumps 115 corresponding to a pair of differential signal transmission terminals 130 may be disposed below the lower surface S2 of the wiring board 100. The external connection bumps 115 may have a ball, pin, or lead shape. For example, the external connection bumps 115 may be solder balls formed of a low-melting-point metal, for example, tin (Sn) or an alloy containing tin (Sn).

The semiconductor chip 200 may be mounted on the upper surface S1 of the wiring board 100. For example, the semiconductor chip 200 may be electrically connected to the first pads 112P1 of the wiring board 100 through the bumps 225. According to an example embodiment, the semiconductor chip 200 may be mounted on the wiring board 100 using a wire bonding method. The semiconductor chip 200 may include a logic chip, such as central processors (CPUs), graphics processors (GPUs), field programmable gate arrays (FPGAs), digital signal processors, cryptographic processors, microprocessors, microcontrollers, analog-to-digital converters, application-specific ICs (ASICs), or a Serializer and Deserializer IC (SerDes IC) including a high-speed serial-to-parallel conversion circuit, or a volatile memory chip such as a dynamic RAM (DRAM), static RAM (SRAM), or the like, or a non-volatile memory chip such as a phase change RAM (PRAM), magnetic RAM (MRAM), resistive RAM (RRAM), flash memory, or the like. An underfill resin 230 may be formed between the semiconductor chip 200 and the wiring board 100. According to an example embodiment, the underfill resin 230 may also be a molded underfill (MUF) covering up to the top surface of the semiconductor chip 200.

Figure 8:
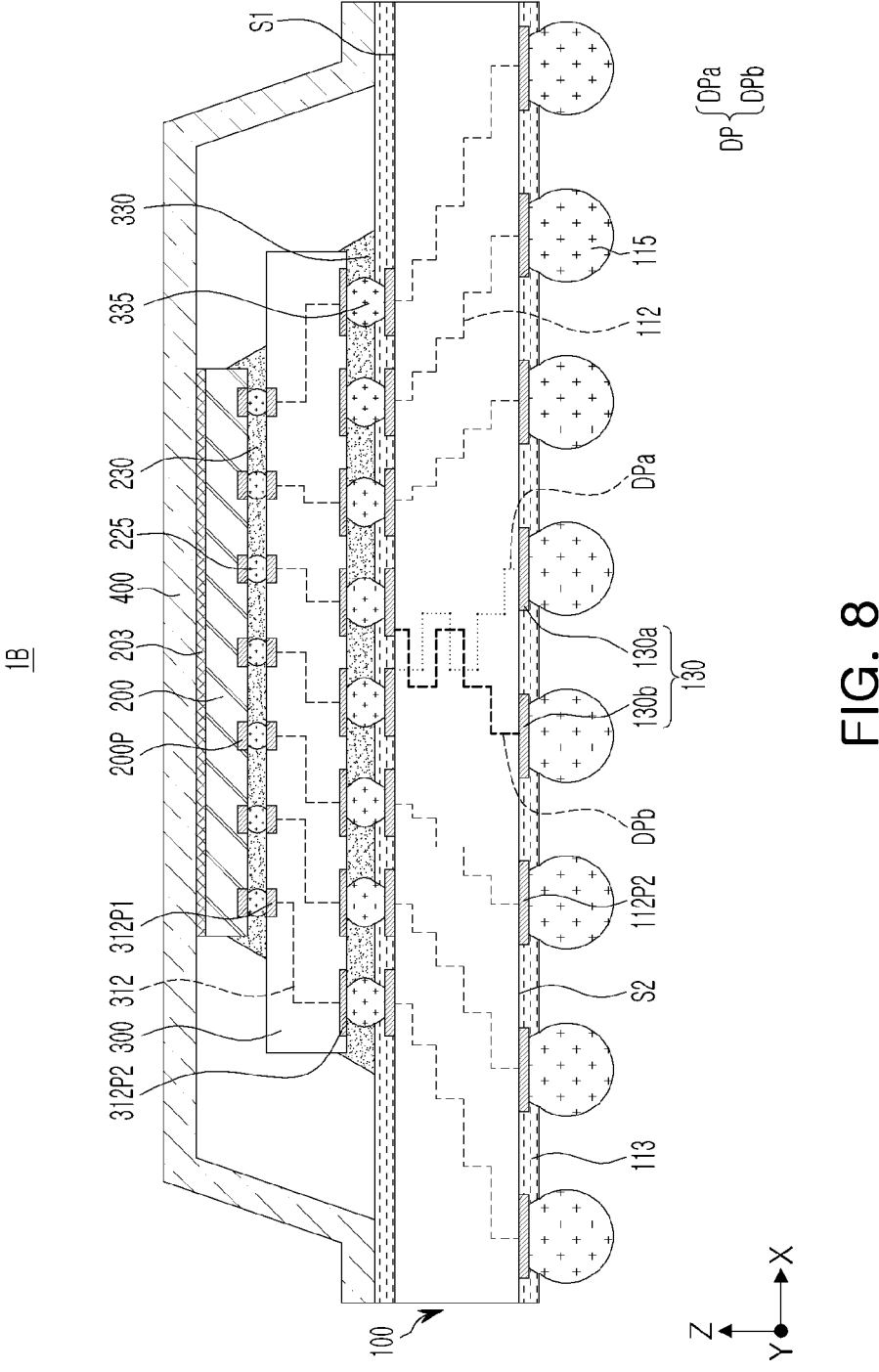
FIG. 8 is a cross-sectional view illustrating a semiconductor package according to an example embodiment.

FIG. 8 is a cross-sectional view illustrating a semiconductor package 1B according to an example embodiment.

Referring to FIG. 8, the semiconductor package 1B according to an example embodiment may have the same or similar characteristics as those described with reference to FIG. 7, except for further including a heat dissipation structure 400 covering the semiconductor chip 200 and the interposer substrate 300 disposed between the wiring board 100 and the semiconductor chip 200.

The interposer substrate 300 may be a substrate for a semiconductor package, such as a printed circuit board (PCB), a ceramic substrate, or a tape wiring board. The interposer substrate 300 may include a redistribution circuit 312 electrically connecting upper terminals 312P1 and lower terminals 312P2. For example, when the interposer substrate 300 is a silicon substrate, the redistribution circuit 312 may be formed of a through silicon via (TSV). The upper terminals 312P1 corresponding to the connection pads 200P of the semiconductor chip 200 may have a smaller size than the lower terminals 312P2. The semiconductor chip 200 may be connected to the upper terminals 312P1 through the first bump 225. The interposer board 300 may be connected to the wiring board 100 through a second bump 335.

A first underfill resin 230 may be formed between the semiconductor chip 200 and the interposer substrate 300, and a second underfill resin 330 may be formed between the interposer substrate 300 and the wiring board 100. According to an example embodiment, the first and second underfill resins 230 and 330 may be MUFs that also cover the upper surface of the semiconductor chip 200.

The heat dissipation structure 400 is disposed on the upper surface S1 of the wiring board 100, and may cover the interposer substrate 300 and the semiconductor chip 200. The heat dissipation structure 400 may be attached to the wiring board 100 by an adhesive. The adhesive may be a thermally conductive adhesive tape, thermally conductive grease, thermally conductive adhesive, or the like. The heat dissipation structure 400 may be in close contact with the semiconductor chip 200 by an adhesive member 203 on the upper surface of the semiconductor chip 200. The heat dissipation structure 400 may include a conductive material having excellent thermal conductivity. For example, the heat dissipation structure 400 may include or ay be formed of a metal or a metal alloy containing gold (Au), silver (Ag), copper (Cu), iron (Fe), or the like or a conductive material such as graphite, graphene or the like. The heat dissipation structure 400 may have a shape different from that illustrated in the drawing, and for example, may be formed to have a shape covering only the upper surface of the semiconductor chip 200.

Figure 9A:
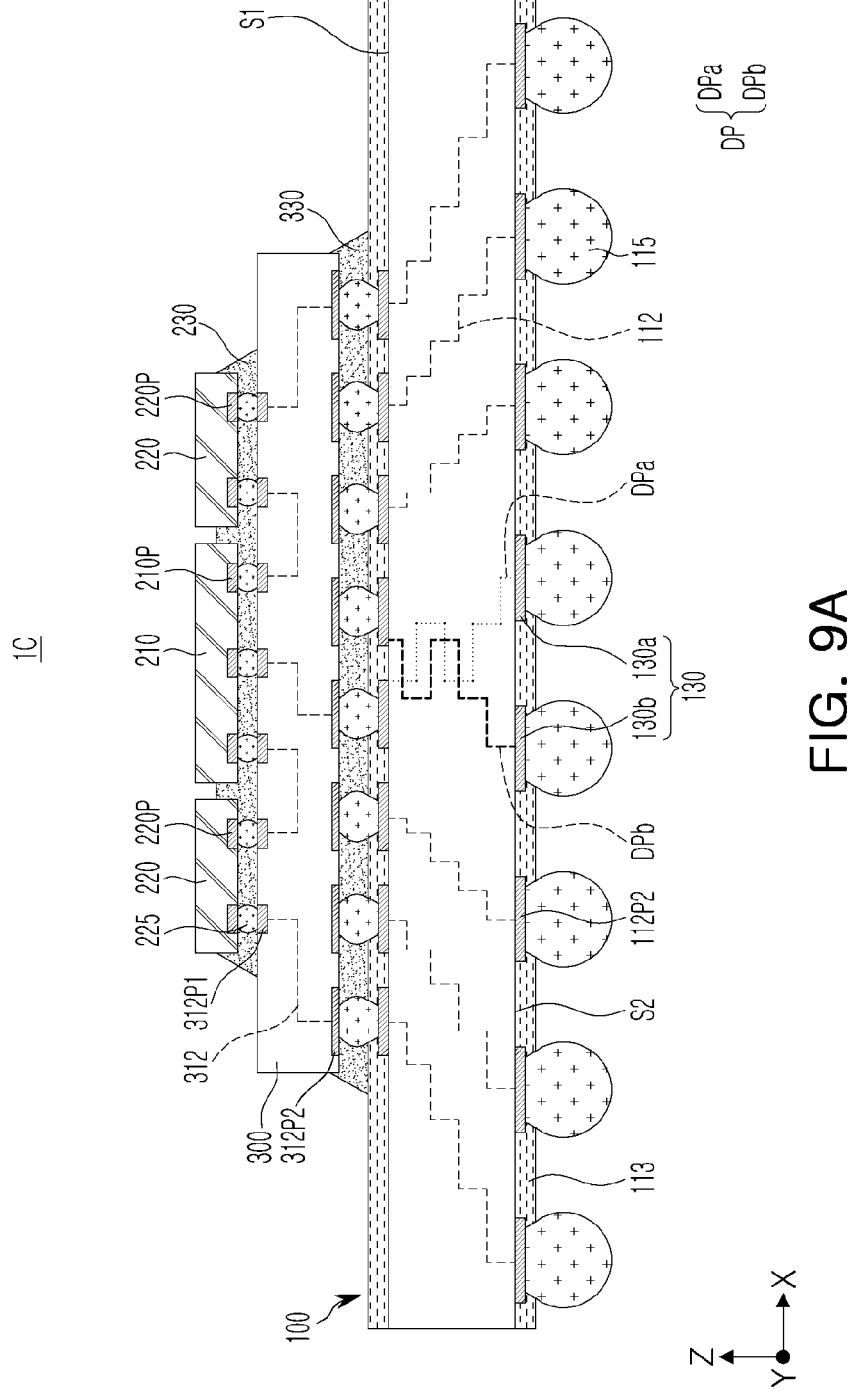
FIG. 9A is a cross-sectional view illustrating a semiconductor package according to an example embodiment.
Figure 9B:
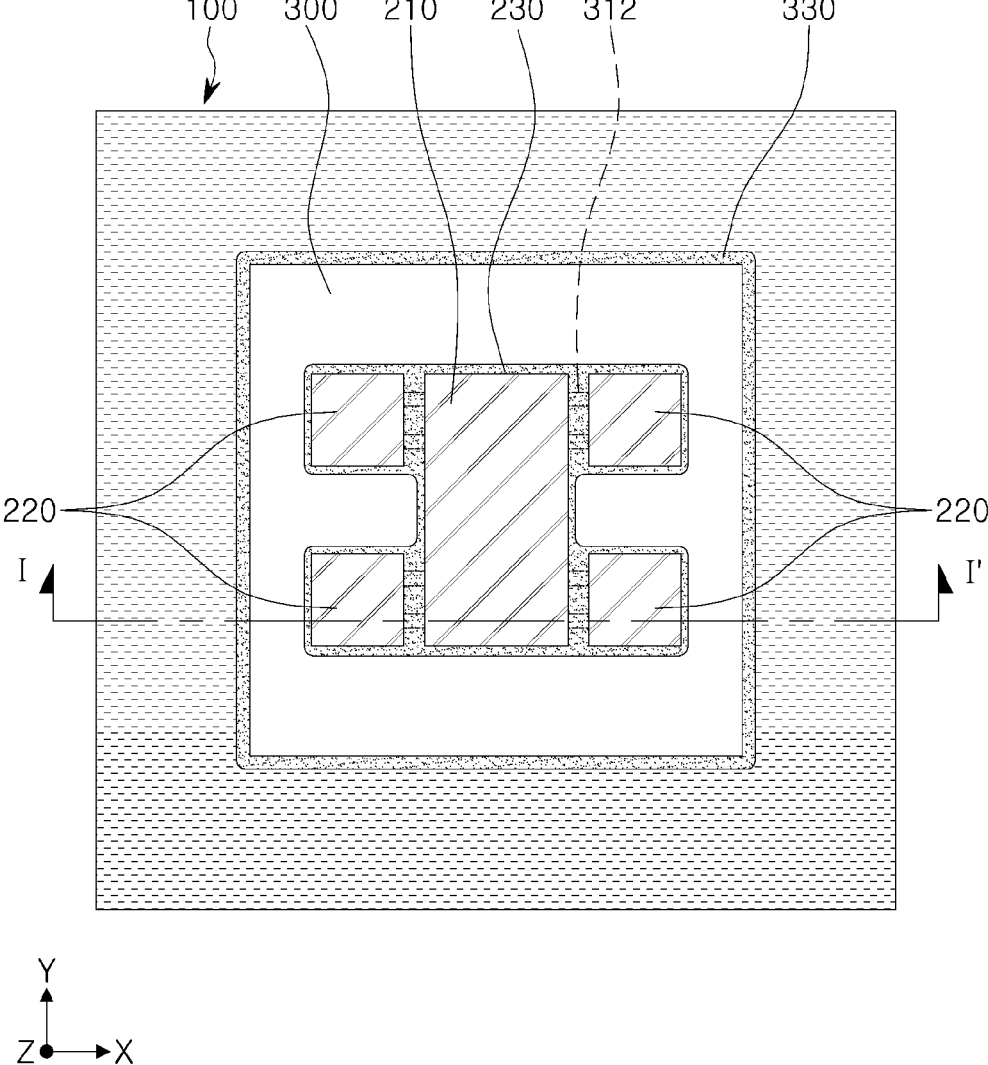
FIG. 9B is a plan view of the semiconductor package of FIG. 9A.

FIG. 9A is a cross-sectional view illustrating a semiconductor package 1C according to an example embodiment, and FIG. 9B is a plan view of the semiconductor package 1C of FIG. 9A. FIG. 9A illustrates a cross-section taken along line I-I' in FIG. 9b.

Referring to FIGS. 9A and 9B, a semiconductor package 1C of an example embodiment may have the same or similar characteristics as those described with reference to FIGS. 7 and 8, except that a plurality of semiconductor chips 210 and 220 are disposed on the interposer substrate 300. For example, the plurality of semiconductor chips 210 and 220 may be provided as the first semiconductor chip 210 and a plurality of second semiconductor chips 220 disposed around the first semiconductor chip 210. The first semiconductor chip 210 and the plurality of second semiconductor chips 220 may be electrically connected to each other through the redistribution circuit 312 of the interposer substrate 300.

The first semiconductor chip 210 and the plurality of second semiconductor chips 220 may include different types of semiconductor chips. For example, the first semiconductor chip 210 may include an application processor chip such as CPU, GPU, a digital signal processor, a cryptographic processor, a microprocessor and a microcontroller, and a logic chip such as an analog-to-digital converter and an ASIC. The plurality of second semiconductor chips 220 may include a memory chip such as DRAM, SRAM, flash, PRAM, ReRAM, FeRAM, or MRAM.

According to an example embodiment, each of the plurality of second semiconductor chips 220 may be provided as a high-performance memory device such as a high bandwidth memory (HBM) product or a hybrid memory cubic (HMC) product.

As set forth above, according to example embodiments, by forming a differential signal connection structure formed of staggered vias between differential signal transmission terminals, a wiring board and a semiconductor package having improved electrical characteristics for differential signals may be provided.

While example embodiments have been illustrated and described above, it will be apparent to those skilled in the art that modifications and variations could be made without departing from the scope of the present inventive concept as defined by the appended claims.

What is claimed is:

1. A semiconductor package comprising:
a wiring board having an upper surface and a lower surface opposing each other, at least a first pair of differential signal transmission lines disposed on the upper surface, at least a first pair of differential signal transmission terminals disposed below the lower surface, and at least a first pair of connection structures electrically connecting each line of the first pair of differential signal transmission lines to each terminal of the first pair of differential signal transmission terminals, respectively;
a semiconductor chip disposed on the upper surface of the wiring board; and
external connection bumps disposed below the lower surface of the wiring board to correspond to the first pair of differential signal transmission terminals, respectively,
wherein the first pair of connection structures includes first via structures disposed to be staggered along a vertical direction with respect to the lower surface, at least one first connection line electrically connecting the first via structures, second via structures staggered along the vertical direction, and at least one second connection line electrically connecting the second via structures, and
the at least one first connection line is spaced apart from the at least one second connection line in the vertical direction and is electrically insulated therefrom, and crosses the at least one second connection line when viewed from the vertical direction.

2. The semiconductor package of claim 1, wherein:
the first via structures and the at least one first connection line form a first differential signal line of the first pair of differential signal transmission lines, the first differential signal line including at least a portion having a square wave shape formed parallel to a first plane,
the second via structures and the at least one second connection line form a second differential signal line of the first pair of differential signal transmission lines, the second differential signal line including at least a portion having a square wave shape formed parallel to the first plane or a second plane, and
the first plane and second plane extend in the vertical direction.

3. The semiconductor package of claim 2, wherein the first plane and the second plane intersect each other.

4. The semiconductor package of claim 1, wherein the first pair of differential signal transmission lines are cross-connected to the first pair of differential signal transmission terminals.

5. The semiconductor package of claim 1, wherein at least some of the first via structures and the second via structures are positioned between the first pair of differential signal transmission terminals, when viewed from the vertical direction.

6. The semiconductor package of claim 1, wherein at least some of the first via structures and the second via structures do not overlap either differential signal transmission terminal of the first pair of differential signal transmission terminals in the vertical direction.

7. The semiconductor package of claim 1, wherein each via structure of the first via structures and each via structure of the second via structures includes one via layer or includes two via layers stacked in the vertical direction.

8. A semiconductor package comprising:
a wiring board having an upper surface and a lower surface opposing each other, the wiring board including at least a first pair of signal transmission lines disposed on the upper surface, at least a first pair of signal transmission terminals disposed below the lower surface, and a first pair of connection structures electrically connecting the first pair of signal transmission lines to the first pair of signal transmission terminals;
a semiconductor chip disposed on the upper surface of the wiring board; and
external connection bumps disposed below the lower surface of the wiring board to correspond to the first pair of signal transmission terminals, respectively,
wherein the first pair of connection structures includes a first connection structure connecting one signal transmission line of the first pair of signal transmission lines to one signal transmission terminal of the first pair of signal transmission terminals and including first via structures alternately disposed and electrically connected to each other on a first axis and a second axis extending in a vertical direction with respect to the lower surface and spaced apart from each other in a horizontal direction with respect to the lower surface, and disposed between the first pair of signal transmission terminals when viewed from the vertical direction, and a second connection structure connecting the other signal transmission line of the first pair of signal transmission lines to the other signal transmission terminal of the first pair of signal transmission terminals and including second via structures alternately disposed and electrically connected to each other on a third axis and a fourth axis extending in the vertical direction and spaced apart from each other in the horizontal direction, and disposed between the first pair of signal transmission terminals without overlapping either signal transmission terminal of the first pair of signal transmission terminals when viewed from the vertical direction.

9. The semiconductor package of claim 8, wherein the first connection structure includes a first connection line connecting a first via structure disposed on the first axis and a first via structure disposed on the second axis, and the second connection structure includes a second connection line connecting a second via structure disposed on the third axis and a second via structure disposed on the fourth axis.

10. The semiconductor package of claim 9, wherein the first axis, the second axis, the third axis, and the fourth axis are disposed such that the first connection line and the second connection line cross each other when viewed from the vertical direction.

11. The semiconductor package of claim 10, wherein the first connection line and the second connection line are located at different vertical levels.

12. The semiconductor package of claim 9, wherein the first axis, the second axis, the third axis, and the fourth axis are disposed such that the first connection line and the second connection line do not cross each other when viewed from the vertical direction.

13. The semiconductor package of claim 8, wherein:
each of the first via structures includes at least one first via layer overlapping the first axis or the second axis, and
each of the second via structures includes at least one second via layer overlapping the third axis or the fourth axis.

14. The semiconductor package of claim 8, wherein at least one of the first via structures includes two or more consecutive via layers stacked along one of the first axis or the second axis and at least one of the second via structures includes two or more consecutive via layers stacked along one of the third axis or the fourth axis.

15. The semiconductor package of claim 8, wherein the first axis, the second axis, the third axis, and the fourth axis do not overlap either signal transmission terminal of the first pair of signal transmission terminals in the vertical direction.

16. The semiconductor package of claim 8, wherein:
the first axis is disposed closer to the first pair of signal transmission lines than the second axis, and
the third axis is disposed closer to the first pair of signal transmission lines than the fourth axis.

17. The semiconductor package of claim 8, wherein a distance between the first pair of signal transmission terminals is greater than a distance between the first pair of signal transmission lines.

18. A semiconductor package comprising:
a wiring board having an upper surface and a lower surface opposing each other, and including at least a first pair of signal transmission lines disposed on the upper surface, at least a first pair of signal transmission terminals disposed below the lower surface, and a first pair of connection structures, crossing each other when viewed from a vertical direction perpendicular to the upper surface of the wiring board, and respectively electrically connecting one signal transmission line of the first pair of signal transmission lines to one signal transmission terminal of the first pair of signal transmission terminals, and the other signal transmission line of the first pair of signal transmission lines to the other signal transmission terminal of the first pair of signal transmission terminals; and
a semiconductor chip disposed on the upper surface of the wiring board.

19. The semiconductor package of claim 18, wherein at least a portion of the first pair of connection structures does not overlap either signal transmission terminal of the first pair of signal transmission terminals in a direction perpendicular to the lower surface.

20. The semiconductor package of claim 18, wherein each connection structure of the first pair of connection structures includes via structures disposed to be staggered along a direction perpendicular to the lower surface.

* * * * *